US012615454B2

(12) United States Patent
Asahi et al.

(10) Patent No.: US 12,615,454 B2
(45) Date of Patent: Apr. 28, 2026

(54) IMAGING ELEMENT AND IMAGING DEVICE

(71) Applicant: SONY SEMICONDUCTOR SOLUTIONS CORPORATION, Kanagawa (JP)

(72) Inventors: Toshihiro Asahi, Kanagawa (JP); Hiroki Tojinbara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 284 days.

(21) Appl. No.: 18/550,280

(22) PCT Filed: Jan. 26, 2022

(86) PCT No.: PCT/JP2022/002785
§ 371 (c)(1),
(2) Date: Sep. 12, 2023

(87) PCT Pub. No.: WO2022/201835
PCT Pub. Date: Sep. 29, 2022

(65) Prior Publication Data
US 2024/0163587 A1 May 16, 2024

(30) Foreign Application Priority Data
Mar. 24, 2021 (JP) ................................ 2021-050709

(51) Int. Cl.
*H04N 25/771* (2023.01)
*H04N 25/13* (2023.01)
(Continued)

(52) U.S. Cl.
CPC ......... *H04N 25/771* (2023.01); *H04N 25/134* (2023.01); *H04N 25/46* (2023.01);
(Continued)

(58) Field of Classification Search
CPC ........ H04N 23/50; H04N 23/51; H04N 23/52; H04N 23/54; H04N 23/55; H04N 23/57;
(Continued)

(56) References Cited

U.S. PATENT DOCUMENTS 9,030,589 B2 * 5/2015 Sasaki .................... H04N 25/46
348/241
2009/0086063 A1 4/2009 Suzuki et al.
(Continued)

FOREIGN PATENT DOCUMENTS

EP 2579311 A2 4/2013
EP 3525239 A1 8/2019
(Continued)

OTHER PUBLICATIONS

International Search Report and Written Opinion prepared by the Japan Patent Office on Apr. 13, 2022, for International Application No. PCT/JP2022/002785, 3 pgs.

*Primary Examiner* — Twyler L Haskins
*Assistant Examiner* — Akshay Trehan
(74) *Attorney, Agent, or Firm* — SHERIDAN ROSS P.C.

(57) ABSTRACT

To prevent a decrease in a saturation charge when a phase difference signal is generated. A pixel includes a plurality of photoelectric conversion sections that is formed on a semiconductor substrate and performs photoelectric conversion of incident light from a subject to generate a charge. An intra-pixel separator separates the plurality of photoelectric conversion sections. An overflow path in the intra-pixel separator transfers charges overflowed in the plurality of photoelectric conversion sections to each other. An overflow gate in the pixel and adjusts a potential of the overflow path. A pixel separator is disposed at a boundary between the pixels. A charge holding section holds the generated charge. A charge transfer section is disposed one-by-one for the plurality of photoelectric conversion sections and transfers (Continued)

the generated charge to the charge holding section. An image signal generating section generates an image signal on the basis of the generated charge.

20 Claims, 32 Drawing Sheets

(51) Int. Cl.

| | |
|---|---|
| *H04N 25/46* | (2023.01) |
| *H04N 25/57* | (2023.01) |
| *H04N 25/621* | (2023.01) |
| *H04N 25/704* | (2023.01) |
| *H04N 25/79* | (2023.01) |
| *H10F 39/00* | (2025.01) |
| *H10F 39/18* | (2025.01) |

(52) U.S. Cl.
CPC .......... *H04N 25/57* (2023.01); *H04N 25/621* (2023.01); *H04N 25/704* (2023.01); *H10F 39/014* (2025.01); *H10F 39/1865* (2025.01); *H10F 39/802* (2025.01); *H10F 39/8037* (2025.01); *H10F 39/807* (2025.01); *H10F 39/811* (2025.01); *H10F 39/813* (2025.01); *H04N 25/79* (2023.01)

(58) Field of Classification Search
CPC .... H04N 25/771; H04N 25/134; H04N 25/46; H04N 25/57; H04N 25/621; H04N 25/704; H04N 25/79; H10F 39/014; H10F 39/1865; H10F 39/802; H10F 39/8037; H10F 39/807; H10F 39/811; H10F 39/813

See application file for complete search history.

(56) References Cited

U.S. PATENT DOCUMENTS

| | | | | |
|---|---|---|---|---|
| 2013/0087875 A1* | 4/2013 | Kobayashi | ........... | H04N 23/687 |
| | | | | 257/443 |
| 2014/0139716 A1* | 5/2014 | Sasaki | .................... | H04N 25/62 |
| | | | | 348/311 |
| 2016/0020236 A1* | 1/2016 | Tanaka | ................ | H10F 39/8033 |
| | | | | 257/233 |
| 2017/0142325 A1 | 5/2017 | Shimokawa et al. | | |
| 2019/0252439 A1* | 8/2019 | Ogawa | .................. | H10F 39/199 |
| 2021/0400224 A1 | 12/2021 | Gocho | | |

FOREIGN PATENT DOCUMENTS

| | | | | | |
|---|---|---|---|---|---|
| EP | 03886144 A1 | 9/2021 | | | |
| JP | 2007-325139 | 12/2007 | | | |
| JP | 2013-041890 | 2/2013 | | | |
| JP | 2013-084742 | 5/2013 | | | |
| JP | 2014-199898 | 10/2014 | | | |
| JP | 2018-142739 | 9/2018 | | | |
| JP | 2019-140252 | 8/2019 | | | |
| WO | WO-2013022111 A1 | 2/2013 | | | |
| WO | WO-2014141621 A1 | 9/2014 | | | |
| WO | WO 2020/105713 | 5/2020 | | | |
| WO | WO-2020105713 A1 * | 5/2020 | .......... | H04N 5/3745 | |

* cited by examiner

1
IMAGING ELEMENT

FIG.22A
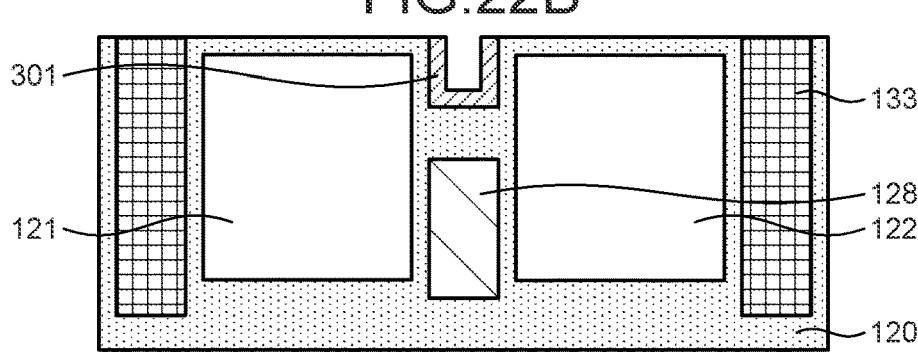
FIG.22B
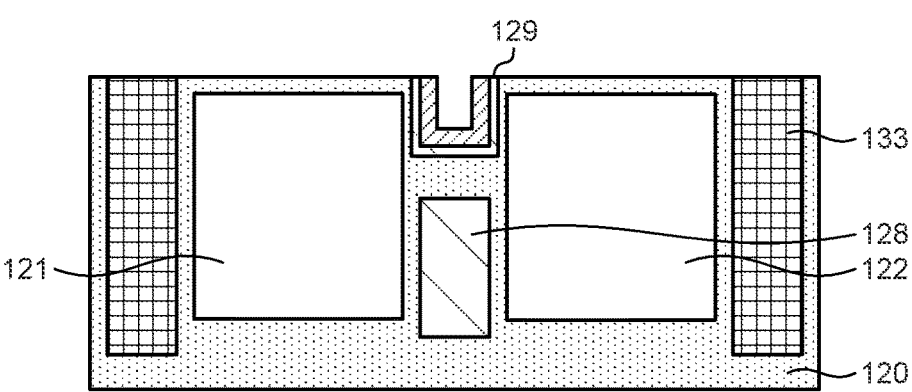
FIG.22C
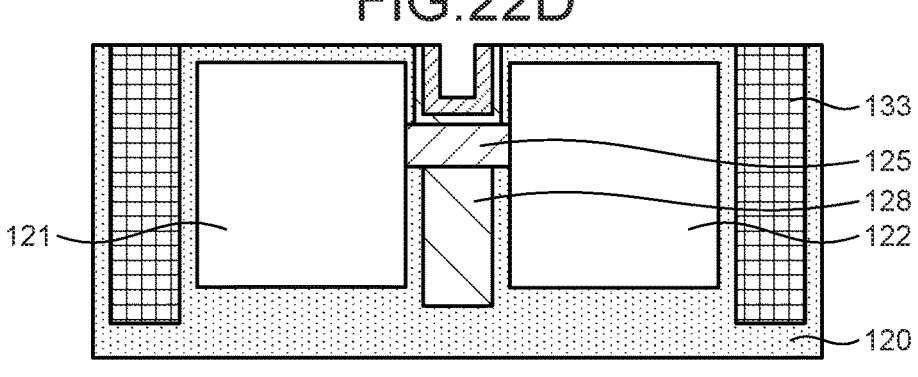
FIG.22D

FIG.30

IMAGING ELEMENT AND IMAGING DEVICE

CROSS REFERENCE TO RELATED APPLICATIONS

This application is a national stage application under 35 U.S.C. 371 and claims the benefit of PCT Application No. PCT/JP2022/002785, having an international filing date of Jan. 26, 2022, which designated the United States, which PCT application claimed the benefit of Japanese Patent Application No. 2021-050709, filed Mar. 24, 2021, the entire disclosures of each of which are incorporated herein by reference.

FIELD

The present disclosure relates to an imaging element and an imaging device.

BACKGROUND

An imaging element in which pixels including two photoelectric conversion sections are disposed in a two-dimensional matrix is used. In this imaging element, it is possible to generate a phase difference signal for detecting an image plane phase difference by pupil-dividing incident light from a subject and an image signal based on the incident light from the subject. When the phase difference signal is generated, two image signals based on charges generated by photoelectric conversion of the two photoelectric conversion sections are output as the phase difference signal. On the other hand, when the image signals are generated, the charges generated by the photoelectric conversion of the two photoelectric conversion sections are added up in the pixel, and the image signal generated based on the added charges is output.

The two photoelectric conversion sections can be separated by, for example, a semiconductor region having a relatively high impurity concentration. Furthermore, the semiconductor region having a relatively high impurity concentration is also disposed between the pixels, and the pixels can be separated from each other.

When light is asymmetrically incident on the two photoelectric conversion sections, a charge accumulated in the photoelectric conversion section on a side where a large amount of light is incident may be saturated. When saturation of the stored charge occurs, a charge newly generated by the photoelectric conversion section overflows from the photoelectric conversion section. When this charge flows into another pixel, an error occurs in an image signal generated by adding the charges. Accordingly, a photoelectric conversion device has been proposed in which a potential barrier of the semiconductor region between two photoelectric conversion sections is made lower than a potential barrier of the semiconductor region between pixels to move charges between the two photoelectric conversion sections (see, for example, Patent Literature 1). In this photoelectric conversion device, the potential barrier of the semiconductor region between the two photoelectric conversion sections is lowered by making the impurity concentration of the semiconductor region between the two photoelectric conversion sections lower than the impurity concentration of the semiconductor region between the pixels.

CITATION LIST

Patent Literature

Patent Literature 1: JP 2018-142739 A

SUMMARY

Technical Problem

However, in the above-described conventional technique, there is a problem that the saturation charge amounts of the photoelectric conversion sections at the time of generating the phase difference signal decrease. Since the potential barrier of the semiconductor region between the two photoelectric conversion sections is lowered, the saturation charge amount of each photoelectric conversion section decreases. There is a problem that a phase difference detectable range when the phase difference signal is detected is narrowed, and convenience is lowered.

Therefore, the present disclosure proposes an imaging element and an imaging device that prevent a decrease in the saturation charge amounts of photoelectric conversion sections when a phase difference signal is generated.

Solution to Problem

The present disclosure has been conceived to solve the problem described above, and the aspect thereof is an imaging element includes: a pixel including a plurality of photoelectric conversion sections that is formed on a semiconductor substrate and performs photoelectric conversion of incident light from a subject to generate a charge; an intra-pixel separator that is disposed in the pixel and separates the plurality of photoelectric conversion sections; an overflow path that is disposed in the intra-pixel separator and transfers charges overflowed in the plurality of photoelectric conversion sections to each other; an overflow gate that is disposed in the pixel and adjusts a potential of the overflow path; a pixel separator disposed at a boundary of the pixel; a charge holding section that holds the generated charge; a plurality of charge transfer sections that is disposed one-by-one for the plurality of photoelectric conversion sections and transfers the generated charge to the charge holding section and causes the charge holding section to hold the charge; and an image signal generating section that generates an image signal on a basis of the held charge.

BRIEF DESCRIPTION OF DRAWINGS

FIG. 22A is a view depicting an example of a method of manufacturing an imaging element according to a sixth embodiment of the present disclosure.

FIG. 22B is a view depicting an example of the method of manufacturing the imaging element according to the sixth embodiment of the present disclosure.

FIG. 22C is a view depicting an example of the method of manufacturing the imaging element according to the sixth embodiment of the present disclosure.

FIG. 22D is a view depicting an example of the method of manufacturing the imaging element according to the sixth embodiment of the present disclosure.

FIG. 30 is a view depicting an example of a schematic configuration of an endoscopic surgery system.

DESCRIPTION OF EMBODIMENTS

Figure 1:
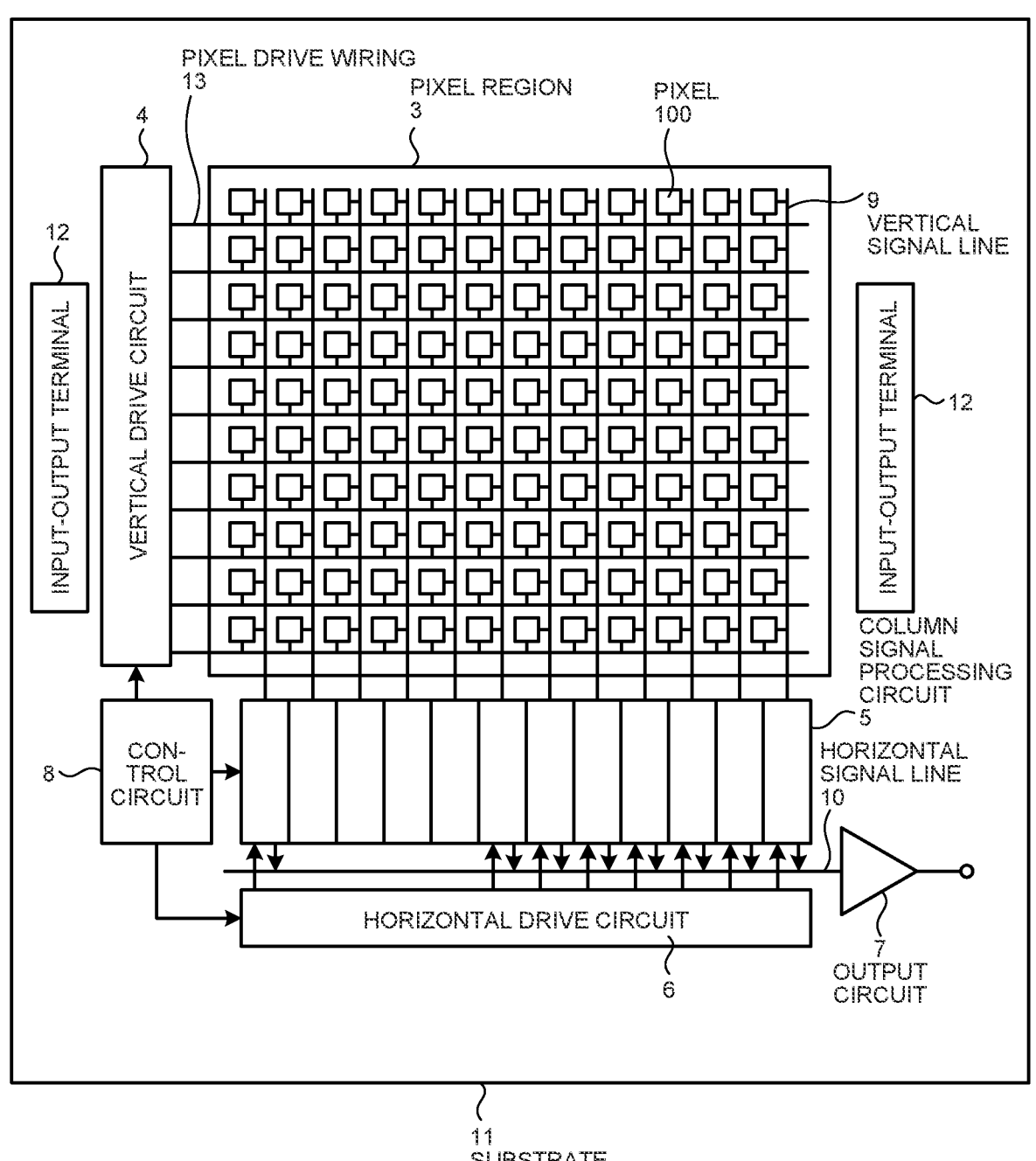
FIG. 1 is a diagram depicting a configuration example of an imaging element according to an embodiment of the present disclosure.

Hereinafter, embodiments of the present disclosure will be described in detail with reference to the drawings. The description will be given in the following order. Note that in each of the following embodiments, the same parts are denoted by the same reference numerals, and redundant description will be omitted.
    1. First Embodiment
    2. Second Embodiment
    3. Third Embodiment
    4. Fourth Embodiment
    5. Fifth Embodiment
    6. Sixth Embodiment
    7. Seventh Embodiment
    8. Eighth Embodiment
    9. Configuration example of imaging device
    10. Application Example to Mobile Body
    11. Application Example to Endoscopic Surgery System

1. First Embodiment

[Configuration of Imaging Element]
    FIG. 1 is a diagram depicting a configuration example of an imaging element according to an embodiment of the present disclosure. As illustrated in FIG. 1, an imaging element 1 of the present example includes a pixel region (what is called an imaging region) 3 in which pixels 100 including a plurality of photoelectric conversion elements is regularly and two-dimensionally arranged on a substrate 11, for example, a silicon substrate, and a peripheral circuit unit. The pixels 100 each include, for example, a photodiode serving as a photoelectric conversion element and a plurality of pixel transistors (what is called MOS transistors). The plurality of pixel transistors can include, for example, three transistors of a transfer transistor, a reset transistor, and an amplification transistor. In addition, a selection transistor can be added to have four transistors. The pixels 100 can have a shared pixel structure. This pixel sharing structure includes a plurality of photodiodes, a plurality of transfer transistors, one shared floating diffusion region, and one shared pixel transistor.

The peripheral circuit unit includes a vertical drive circuit 4, a column signal processing circuit 5, a horizontal drive circuit 6, an output circuit 7, a control circuit 8, and the like.

The control circuit 8 receives an input clock and data instructing an operation mode and the like, and outputs data such as internal information of the imaging element. That is, the control circuit 8 generates a clock signal or a control signal serving as a reference of operations of the vertical drive circuit 4, the column signal processing circuit 5, the horizontal drive circuit 6, and the like on the basis of a vertical synchronization signal, a horizontal synchronization signal, and a master clock. Then, these signals are input to the vertical drive circuit 4, the column signal processing circuit 5, the horizontal drive circuit 6, and the like.

The vertical drive circuit 4 includes, for example, a shift register, selects a pixel drive wiring 13, supplies a pulse for driving the pixels to the selected pixel drive wiring, and drives the pixels in units of rows. That is, the vertical drive circuit 4 selectively scans each pixel 100 in the pixel region 3 sequentially in the vertical direction in units of rows, and supplies, to the column signal processing circuit 5, a pixel signal based on a signal charge generated according to the amount of received light in, for example, a photodiode serving as a photoelectric conversion element of each pixel 100 through a vertical signal line 9.

The column signal processing circuit 5 is disposed, for example, for each column of the pixels 100, and performs signal processing such as noise removal on the signals output from the pixels 100 of one row for each pixel column. That is, the column signal processing circuit 5 performs signal processing such as correlated double sampling (CDS) for removing fixed pattern noise unique to the pixels 100, signal amplification, and AD conversion. A horizontal selection switch (not illustrated) is connected and provided between an output stage of the column signal processing circuit 5 and a horizontal signal line 10. Note that the column signal processing circuit 5 is an example of a processing circuit described in the claims.

The horizontal drive circuit 6 includes, for example, a shift register, sequentially selects each of the column signal processing circuits 5 by sequentially outputting horizontal scanning pulses, and causes each of the column signal processing circuits 5 to output a pixel signal to the horizontal signal line 10.

Figure 2:
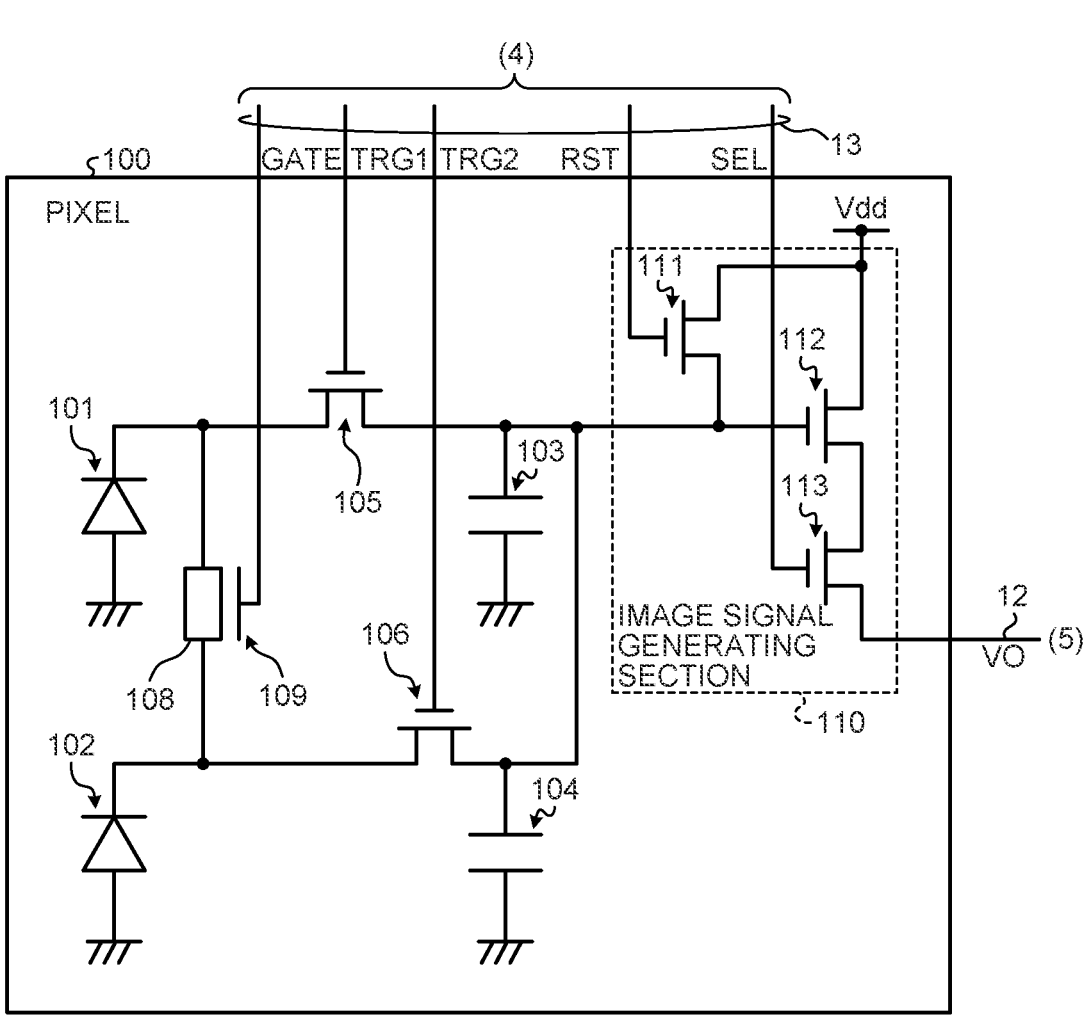
FIG. 2 is a diagram depicting a configuration example of a pixel according to the embodiment of the present disclosure.

The output circuit 7 performs signal processing on the signals sequentially supplied from each of the column signal processing circuits 5 through the horizontal signal line 10, and outputs the processed signals. For example, only buffering may be performed, or black level adjustment, column variation correction, various digital signal processing, and the like may be performed. An input-output terminal 12 exchanges signals with the outside.
[Configuration of Imaging Element]
    FIG. 2 is a diagram depicting a configuration example of a pixel according to the embodiment of the present disclosure. The drawing is a circuit diagram depicting a configuration example of the pixel 100 according to the embodiment of the present disclosure. The pixel 100 includes photoelectric conversion sections 101 and 102, charge holding sections 103 and 104, charge transfer sections 105 and 106, a reset transistor 111, an amplification transistor 112, a selection transistor 113, an overflow path 108, and an overflow gate 109. Note that a circuit including the reset transistor 111, the amplification transistor 112, and the selection transistor 113 constitutes an image signal generating section 110. Furthermore, the charge transfer sections 105 and 106, the reset transistor 111, the amplification transistor 112, and the selection transistor 113 can include n-channel MOS transistors.

As described above, the pixel drive wiring 13 and the vertical signal line 9 are wired to the pixel 100. The pixel drive wiring 13 in the drawing includes a signal line GATE, a signal line TRG1, a signal line TRG2, a signal line RST, and a signal line SEL. Furthermore, the vertical signal line 9 includes a signal line VO. In addition, a power supply line Vdd is wired to the pixel 100. The power supply line Vdd is a wiring that supplies power to the pixel 100.

The anode of the photoelectric conversion section 101 is grounded, and the cathode is connected to a source of the charge transfer section 105. The anode of the photoelectric conversion section 102 is grounded, and the cathode is connected to a source of the charge transfer section 106. The drain of the charge transfer section 105 is connected to a source of the reset transistor 111, a gate of the amplification transistor 112, the drain of the charge transfer section 106, one end of the charge holding section 103, and one end of the charge holding section 104. The other end of the charge holding section 103 and the other end of the charge holding section 104 are grounded. The drain of the reset transistor 111 is connected to the power supply line Vdd. The drain of the amplification transistor 112 is connected to the power supply line Vdd, and the source is connected to the drain of the selection transistor 113. A source of the selection transistor 113 is connected to the signal line VO. The overflow path 108 is connected between the cathode of the photoelectric conversion section 101 and the cathode of the photoelectric conversion section 102.

The signal line GATE, the signal line TRG1, and the signal line TRG2 are connected to the overflow gate 109, a gate of the charge transfer section 105, and a gate of the charge transfer section 106, respectively. The signal line RST and the signal line SEL are connected to a gate of the reset transistor 111 and a gate of the selection transistor 113, respectively.

The photoelectric conversion sections 101 and 102 perform photoelectric conversion of incident light. The photoelectric conversion sections 101 and 102 can be constituted by photodiodes formed on a semiconductor substrate 120 described later. The photoelectric conversion sections 101 and 102 perform photoelectric conversion of incident light in an exposure period and hold charges generated by photoelectric conversion.

The charge holding sections 103 and 104 hold charges generated by the photoelectric conversion sections 101 and 102. The charge holding sections 103 and 104 in the drawing are examples in a case where they are connected in parallel. The charge holding sections 103 and 104 can be formed by floating diffusion (FD) region which is a semiconductor region formed in the semiconductor substrate 120.

The charge transfer sections 105 and 106, the reset transistor 111, the amplification transistor 112, and the selection transistor 113 in the drawing can be constituted by n-channel MOS transistors. In this n-channel MOS transistor, a drain and a source can be conducted by applying a voltage exceeding a threshold of a gate-source voltage Vgs to the gate. Hereinafter, a voltage exceeding the threshold of the gate-source voltage Vgs is referred to as an ON voltage. The control signal including the ON voltage is transmitted by the signal line TRG1 or the like.

The charge transfer sections 105 and 106 transfer charges. The charge transfer section 105 transfers the charge generated by the photoelectric conversion of the photoelectric conversion section 101 to the charge holding sections 103 and 104, and the charge transfer section 106 transfers the charge generated by the photoelectric conversion of the photoelectric conversion section 102 to the charge holding sections 103 and 104. The charge transfer sections 105 and 106 transfer charges by conducting the photoelectric conversion sections 101 and 102 and the charge holding sections 103 and 104, respectively. The control signals of the charge transfer sections 105 and 106 are transmitted by the signal lines TRG1 and TRG2, respectively.

The image signal generating section 110 generates an image signal on the basis of the charges held in the charge holding sections 103 and 104. As described above, the image signal generating section 110 includes the reset transistor 111, the amplification transistor 112, and the selection transistor 113.

The reset transistor 111 resets the charge holding sections 103 and 104. This reset can be performed by discharging the charges of the charge holding sections 103 and 104 by conducting between the charge holding sections 103 and 104 and the power supply line Vdd. A control signal of the reset transistor 111 is transmitted by the signal line RST.

The amplification transistor 112 amplifies the voltages of the charge holding sections 103 and 104. The gate of the amplification transistor 112 is connected to the charge holding sections 103 and 104. Thus, an image signal having a voltage corresponding to the charges held in the charge holding sections 103 and 104 is generated at a source of the amplification transistor 112. Furthermore, the image signal can be output to the signal line VO by making the selection transistor 113 conductive. A control signal of the selection transistor 113 is transmitted by the signal line SEL.

The overflow path 108 transfers the charge overflowed between the photoelectric conversion sections 101 and 102 to each other. The overflow path 108 can be formed by a semiconductor region disposed between the photoelectric conversion sections 101 and 102.

The overflow gate 109 is an electrode disposed adjacent to the overflow path 108. The overflow gate 109 adjusts a potential barrier of the overflow path 108.

When the phase difference signal is generated in the pixel 100, the charge transfer sections 105 and 106 individually transfer the charges generated by the photoelectric conversion sections 101 and 102 to the charge holding sections 103 and 104. This transfer of charge is referred to as individual transfer. Thereafter, the phase difference signal is generated by the image signal generating section 110 on the basis of the charges individually transferred to the charge holding sections 103 and 104. Hereinafter, a mode for generating the phase difference signal is referred to as a phase difference signal mode.

On the other hand, when an image signal is generated in the pixel 100, the charge transfer sections 105 and 106 commonly transfer the charges generated by the photoelectric conversion sections 101 and 102 to the charge holding sections 103 and 104. In this case, the charge holding sections 103 and 104 simultaneously hold the charges generated by the photoelectric conversion sections 101 and 102. This charge transfer is referred to as collective transfer. Furthermore, a mode for generating the image signal is referred to as an image signal mode.

[Configuration of Plane of Imaging Element]

Figure 3:
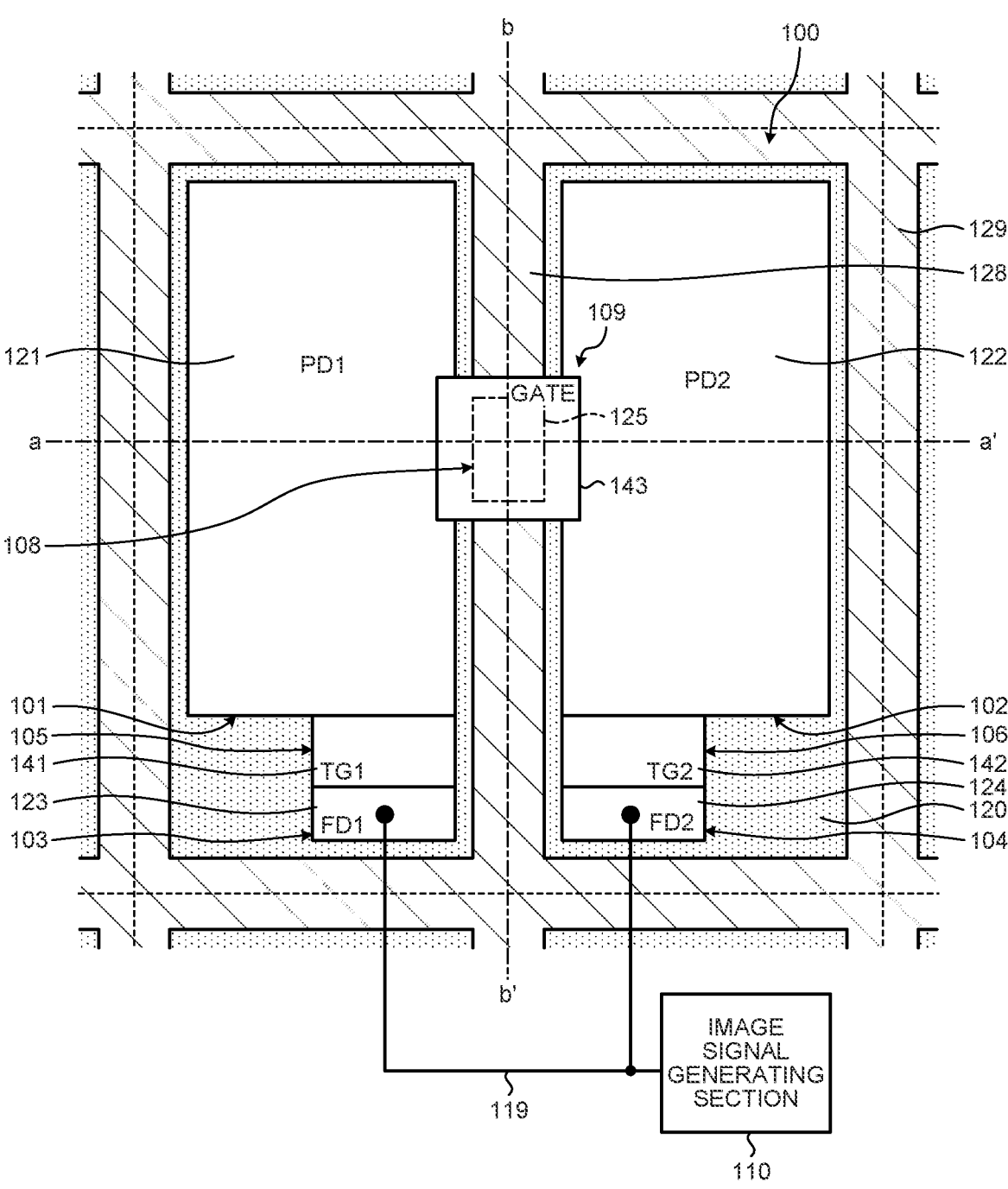
FIG. 3 is a view depicting a configuration example of the pixel according to the first embodiment of the present disclosure.

FIG. 3 is a view depicting a configuration example of the pixels according to the first embodiment of the present disclosure. The drawing is a plan view depicting the configuration example of the pixels 100 according to the first embodiment of the present disclosure. The drawing illustrates a configuration of the pixels 100 in the semiconductor substrate 120. A dotted rectangle in the drawing represents a region of the pixels 100. Furthermore, an outlined rectangle represents a semiconductor region formed in the semiconductor substrate 120 and a gate electrode disposed on a front surface side of the semiconductor substrate 120. Semiconductor regions 121 and 122 forming the photoelectric conversion sections 101 and 102, respectively, are disposed in the pixels 100, and the charge transfer sections 105 and 106 are disposed adjacent to the semiconductor regions 121 and 122. In the drawing, gate electrodes 141 and 142 of the charge transfer sections 105 and 106 are illustrated. Semiconductor regions 123 and 124 forming the charge holding sections 103 and 104 are disposed adjacent to the charge transfer sections 105 and 106.

An intra-pixel separator 128 is disposed between the photoelectric conversion sections 101 and 102. The intra-pixel separator 128 separates the photoelectric conversion sections 101 and 102. Furthermore, a pixel separator 129 is disposed at the boundary of the pixels 100. The pixel separator 129 is formed in a shape surrounding the pixels 100 and separates the adjacent pixels 100 from each other.

Note that the image signal generating section 110 is further illustrated in the drawing. The drawing illustrates an example in which the image signal generating section 110 is disposed in a region other than the pixels 100. The pixels in the drawing are connected to the charge holding sections 103 and 104 by signal lines 119.

[Configuration of Cross-Section of Imaging Element]

Figure 4A:
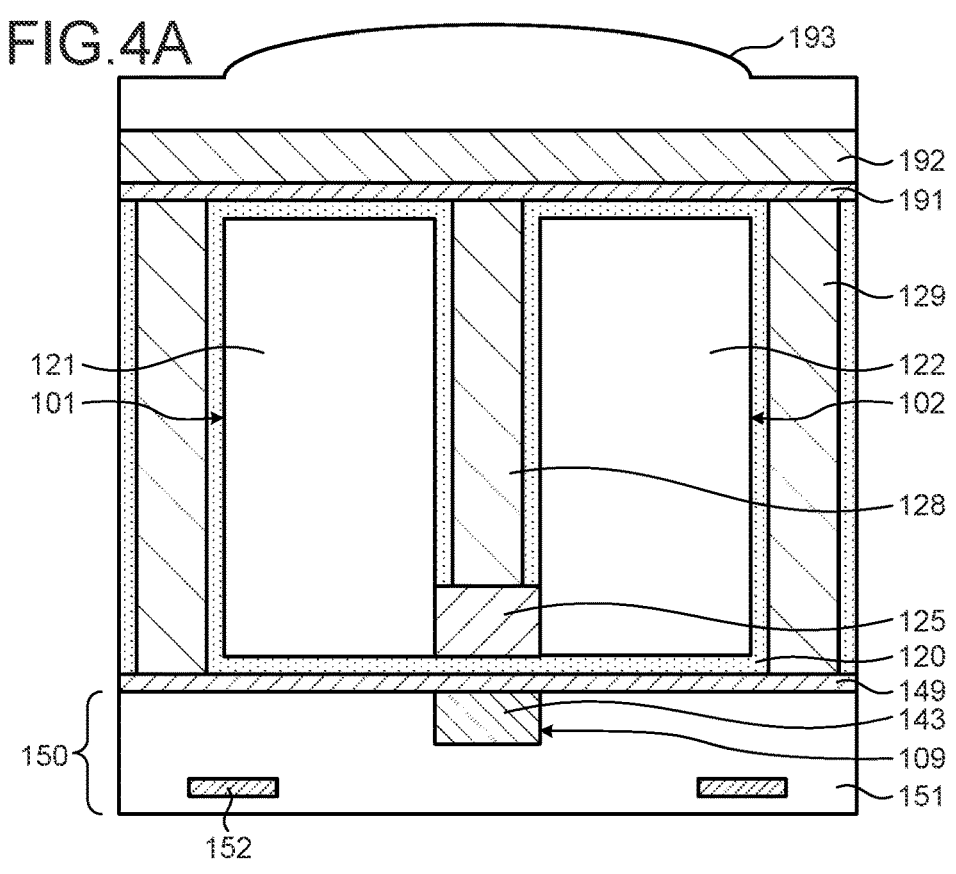
FIG. 4A is a cross-sectional view depicting the configuration example of the pixel according to the first embodiment of the present disclosure.
Figure 4B:
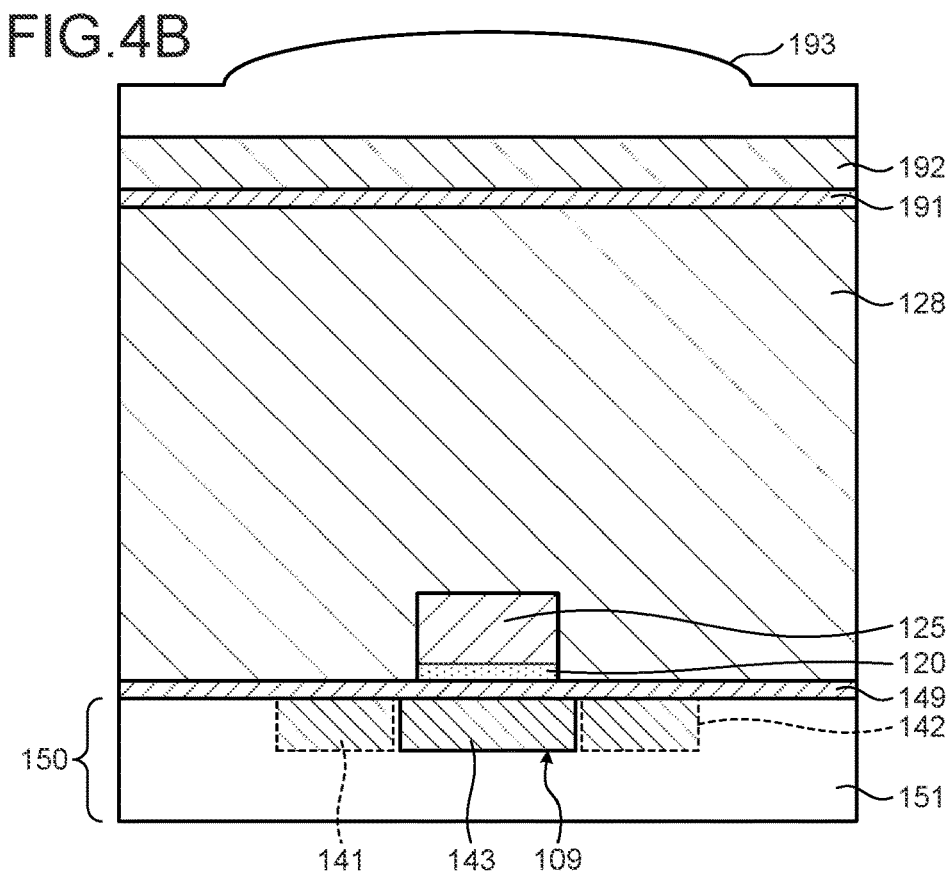
FIG. 4B is a cross-sectional view depicting the configuration example of the pixel according to the first embodiment of the present disclosure.

FIGS. 4A and 4B are cross-sectional views depicting the configuration example of the pixel according to the first embodiment of the present disclosure. FIG. 4A corresponds to a cross-sectional view of the pixel 100 taken along line a-a' in FIG. 3, and FIG. 4B corresponds to a cross-sectional view of the pixel 100 taken along line b-b' in FIG. 3. The pixel 100 in the drawing includes the semiconductor substrate 120, insulating films 149 and 191, a wiring region 150, a color filter 192, and an on-chip lens 193.

The semiconductor substrate 120 is a semiconductor substrate in which a diffusion layer of the element of the pixel 100 is disposed. The semiconductor substrate 120 can include, for example, silicon (Si). The elements such as the photoelectric conversion section 101 can be disposed in a well region formed in the semiconductor substrate 120. For convenience, the semiconductor substrate 120 in the drawing is assumed to be formed in a p-type well region. By disposing an n-type or p-type semiconductor region in the well region, a diffusion layer of the element can be formed. In the drawing, the photoelectric conversion sections 101 and 102 and the overflow path 108 are illustrated.

The photoelectric conversion section 101 is formed by the n-type semiconductor region 121. Specifically, a photodiode formed by a pn junction at an interface between the n-type semiconductor region 121 and the surrounding p-type well region corresponds to the photoelectric conversion section 101. Similarly, the photoelectric conversion section 102 is formed by the n-type semiconductor region 122. Charges generated by photoelectric conversion of the photoelectric conversion sections 101 and 102 during the exposure period are accumulated in the n-type semiconductor regions 121 and 122. The accumulated charges are transferred to and held in the charge holding sections 103 and 104 by the charge transfer sections 105 and 106 after the lapse of the exposure period.

The intra-pixel separator 128 is disposed between the photoelectric conversion sections 101 and 102. The intra-pixel separator 128 is formed by a semiconductor region having a relatively high p-type impurity concentration, and electrically separates the n-type semiconductor regions 121 and 122 forming the photoelectric conversion sections 101 and 102.

Furthermore, the pixel separator 129 is disposed at the boundary of the pixel 100 of the semiconductor substrate 120. The pixel separator 129 is formed by a semiconductor region having a p-type relatively high impurity concentration, and electrically separates the adjacent pixels 100 from each other.

The insulating film 149 is a film that insulates the front surface side of the semiconductor substrate 120. The insulating film 149 can include silicon oxide (SiO₂) or silicon nitride (SiN).

The gate electrodes 141, 142, and 143 are disposed on the front surface side of the semiconductor substrate 120. The gate electrodes 141 and 142 constitute the gates of the charge transfer sections 105 and 106, respectively. Furthermore, the gate electrode 143 constitutes the overflow gate 109. The overflow gate 109 adjusts a potential barrier of the overflow path 108. By applying a voltage to the overflow gate 109, the height of the potential barrier of the overflow path 108 can be adjusted. The gate electrodes 141, 142, and 143 can include polycrystalline silicon. Note that the insulating film 149 below the gate electrodes 141, 142, and 143 constitutes a gate insulating film.

The wiring region 150 is a region disposed on the front surface side of the semiconductor substrate 120 and in which the wiring of the pixel 100 is disposed. The wiring region 150 includes a wiring 152 and an insulating layer 151. The wiring 152 transmits a signal or the like of an element of the pixel 100. The wiring 152 can include a conductor such as copper (Cu) or tungsten (W). The insulating layer 151 insulates the wiring 152 and the like. The insulating layer 151 can include, for example, SiO₂.

The insulating film 191 insulates the back surface side of the semiconductor substrate 120. The insulating film 191 can include, for example, SiO₂.

The color filter 192 is an optical filter that transmits light of a predetermined wavelength among the incident light. As the color filter 192, for example, a color filter that transmits red light, green light, and blue light can be used.

The on-chip lens 193 is a lens that condenses incident light. The on-chip lens 193 is formed in a hemispherical shape, and condenses incident light on the photoelectric conversion sections 101 and 102.

There is a limit to the amount of charges that can be accumulated in the n-type semiconductor regions 121 and 122. This accumulable charge amount is referred to as a saturation charge amount Qs. This Qs varies depending on the size of the n-type semiconductor region 121 and the like, and charges generated exceeding Qs overflow from the n-type semiconductor region 121 and the like. When the overflowed charge flows into the photoelectric conversion section 101 or the like of another pixel 100 and an image signal is generated, an error occurs in the image signal. Accordingly, the charge overflowing from the photoelectric conversion section 101 and the like is discharged to the charge holding section 103 and the like of its own pixel 100. This can be performed by making the height of the potential barrier of the charge transfer section 105 and the like lower than the potential barrier of the pixel separator 129. The charges discharged to the charge holding section 103 and the like during the exposure period are discharged by resetting after the lapse of the exposure period.

On the other hand, the photoelectric conversion sections 101 and 102 are disposed in the pixel 100 in the drawing. Even when the charge of any one of the photoelectric conversion sections 101 and 102 exceeds Qs, overflow of the charge occurs. This overflowed charge flows into the charge holding section 103 and the like. Since this charge is discharged by resetting after the lapse of the exposure period, an error occurs in the image signal in the image signal mode in which the charges generated by the photoelectric conversion sections 101 and 102 are added to generate the image signal. This is because the charges overflowing from one of the photoelectric conversion sections 101 and 102 are not reflected in the summed image signal, and the linearity in the characteristics of the image signal voltage with respect to the amount of incident light on the pixel 100 decreases.

Accordingly, the overflow path 108 is disposed between the photoelectric conversion sections 101 and 102. The overflow path 108 is formed by an n-type semiconductor region 125. As will be described later, the overflow path 108 is formed as a potential barrier lower than a potential barrier of the charge transfer section 105 or the like, and can transfer charges overflowed in the photoelectric conversion sections 101 and 102 to each other. For example, in a case where the charge of the photoelectric conversion section 101 reaches Qs while the charge of the photoelectric conversion section 102 does not reach Qs, the charge moves from the n-type semiconductor region 121 of the photoelectric conversion section 101 to the n-type semiconductor region 122 of the photoelectric conversion section 102 through the overflow path 108. By disposing the overflow path 108, it is possible to reduce an error of the image signal when the charges of the photoelectric conversion sections 101 and 102 are added.

Meanwhile, in the pixel 100 in the drawing, in order to lower the potential barrier of the overflow path 108, the charge amount that can be accumulated in each of the photoelectric conversion sections 101 and 102 is lower than Qs. In the phase difference signal mode, the maximum value of the signal level of the phase difference signal decreases. Thus, the range of the phase difference of the detectable subject is narrowed. Accordingly, the overflow gate 109 is disposed adjacent to the overflow path 108. By applying a voltage to the overflow gate 109, the potential of the overflow path 108 can be adjusted, and the potential barrier can be adjusted.

[Generation of Image Signal and Phase Difference Signal]

Figure 5:
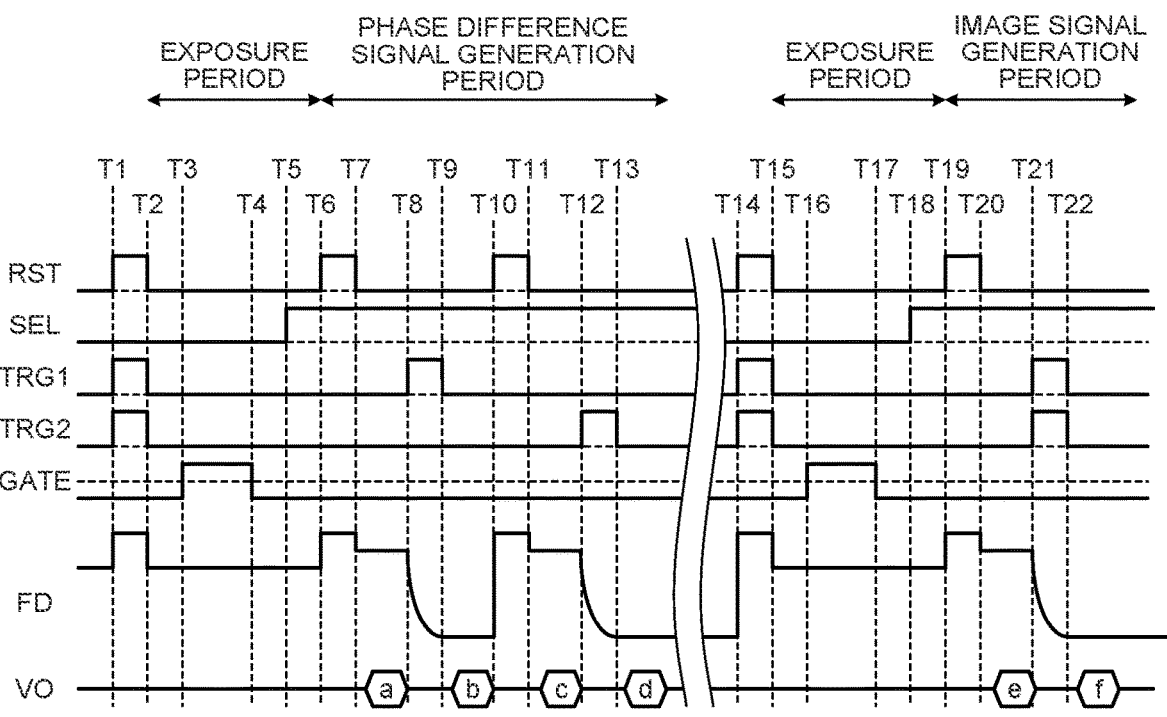
FIG. 5 is a diagram depicting an example of generation of an image signal and a phase difference signal according to the embodiment of the present disclosure.

FIG. 5 is a diagram depicting an example of generation of the image signal and the phase difference signal according to the embodiment of the present disclosure. The drawing is a timing chart depicting an example of generation of the image signal and the phase difference signal in the pixel 100.

"RST", "SEL", "TRG1", "TRG2", and "GATE" in the drawing represent signals of the signal line RST, the signal line SEL, the signal line TRG1, the signal line TRG2, and the signal line GATE, respectively. These represent the waveforms of the binarized control signals, and the portion of the value "1" represents a region where an ON signal is transmitted. Furthermore, the broken line indicates the level of 0 V. Further, "FD" represents the potential of the charge holding sections 103 and 104. Furthermore, "VO" represents an output of the signal line VO. The first half of the drawing represents the procedure of the phase difference signal mode, and the second half represents the procedure of the image signal mode.

In the initial state, a value "0" is applied to the signal line RST, the signal line SEL, the signal line TRG1, and the signal line TRG2. Further, a negative gate voltage is applied to the signal line GATE. Thus, the potential barrier of the overflow path 108 can be increased.

At T1, the ON signal is applied to the signal lines RST, TRG1, and TRG2. Thus, the reset transistor 111 and the charge transfer sections 105 and 106 are conducted, and the photoelectric conversion sections 101 and 102 and the charge holding sections 103 and 104 are reset.

At T2, the application of the ON signal to the signal lines RST, TRG1, and TRG2 is stopped. Thus, the exposure period is started, and charges generated by photoelectric conversion are accumulated in the photoelectric conversion sections 101 and 102.

At T3, a positive gate voltage is applied to the signal line GATE. Thus, the potential barrier of the overflow path 108 can be lowered.

At T4, a negative gate voltage is applied to the signal line GATE.

At T5, the ON signal is applied to the signal line SEL. The application of the ON signal to the signal line SEL is continued until the phase difference signals of all the pixels 100 in the pixel region 3 are output.

At T6, the ON signal is applied to the signal line RST, and the charge holding sections 103 and 104 are reset. At T6, the exposure period ends.

At T7, the application of the ON signal to the signal line RST is stopped. During the period until the next T8, an image signal a at the time of reset is output from the signal line VO.

At T8, the ON signal is applied to the signal line TRG1. The charge transfer section 105 is conducted, and the charge accumulated in the photoelectric conversion section 101 is transferred to the charge holding sections 103 and 104. Thus, the potential of the FD decreases.

At T9, the application of the ON signal to the signal line TRG1 is stopped. In a period until the next T10, an image signal b corresponding to the charge of the photoelectric conversion section 101 is output from the signal line VO. The above-described CDS is executed by the image signal a and the image signal b, and the phase difference signal is generated.

At T10, the ON signal is applied to the signal line RST, and the charge holding sections 103 and 104 are reset.

At T11, the application of the ON signal to the signal line RST is stopped. An image signal c at the time of reset is output from the signal line VO in a period until the next T12.

At T12, the ON signal is applied to the signal line TRG2. The charge transfer section 106 is conducted, and the charge accumulated in the photoelectric conversion section 102 is transferred to the charge holding sections 103 and 104. Thus, the potential of the FD decreases.

At T13, the application of the ON signal to the signal line TRG2 is stopped. Thereafter, an image signal d corresponding to the charge of the photoelectric conversion section 102 is output from the signal line VO. CDS is executed by the image signal c and the image signal d, and the phase difference signal is generated.

In this manner, two phase difference signals can be generated in the phase difference signal mode. Next, the image signal mode will be described.

At T14, the ON signal is applied to the signal lines RST, TRG1, and TRG2. Thus, the reset transistor 111 and the charge transfer sections 105 and 106 are conducted, and the photoelectric conversion sections 101 and 102 and the charge holding sections 103 and 104 are reset.

At T15, the application of the ON signal to the signal lines RST, TRG1, and TRG2 is stopped. Thus, the exposure period is started, and charges generated by photoelectric conversion are accumulated in the photoelectric conversion sections 101 and 102.

At T16, a positive gate voltage is applied to the signal line GATE. Thus, the potential barrier of the overflow path 108 can be lowered.

At T17, a negative gate voltage is applied to the signal line GATE.

At T18, the ON signal is applied to the signal line SEL. The application of the ON signal to the signal line SEL is continued until the image signals of all the pixels 100 in the pixel region 3 are output.

At T19, the ON signal is applied to the signal line RST, and the charge holding sections 103 and 104 are reset. At T19, the exposure period ends.

At T20, the application of the ON signal to the signal line RST is stopped. An image signal e at the time of reset is output from the signal line VO in a period until the next T21.

At T21, the ON signal is applied to the signal lines TRG1 and TRG2. The charge transfer sections 105 and 106 are conducted, and the charges accumulated in the photoelectric conversion sections 101 and 102 are transferred to the charge holding sections 103 and 104. Thus, the potential of the FD decreases.

At T22, the application of the ON signal to the signal lines TRG1 and TRG2 is stopped. Thereafter, an image signal f corresponding to the charges of the photoelectric conversion sections 101 and 102 is output from the signal line VO. CDS is executed by the image signal e and the image signal f, and the image signal is generated.

Note that the gate voltage of the signal line GATE at T3 to T4 of the phase difference signal mode and the gate voltage of the signal line GATE at T16 to T17 of the image signal mode can have different values. Specifically, the gate voltage at T3 to T4 can be set to a low voltage. Thus, the potential barrier of the overflow path 108 in the phase difference signal mode can be made higher than that in the image signal mode.

[Effect of Overflow Gate]

Figure 6A:
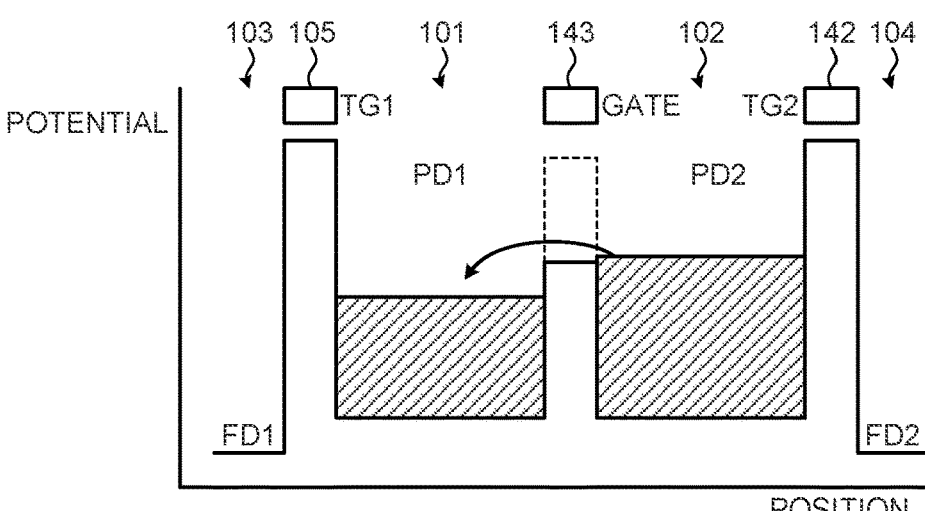
FIG. 6A is a diagram depicting an effect of an overflow gate according to an embodiment of the present disclosure.
Figure 6B:
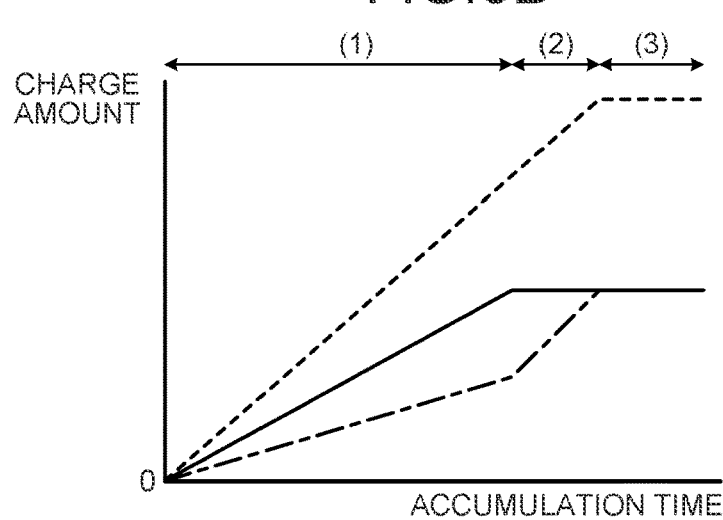
FIG. 6B is a diagram depicting an effect of the overflow gate according to the embodiment of the present disclosure.
Figure 6C:
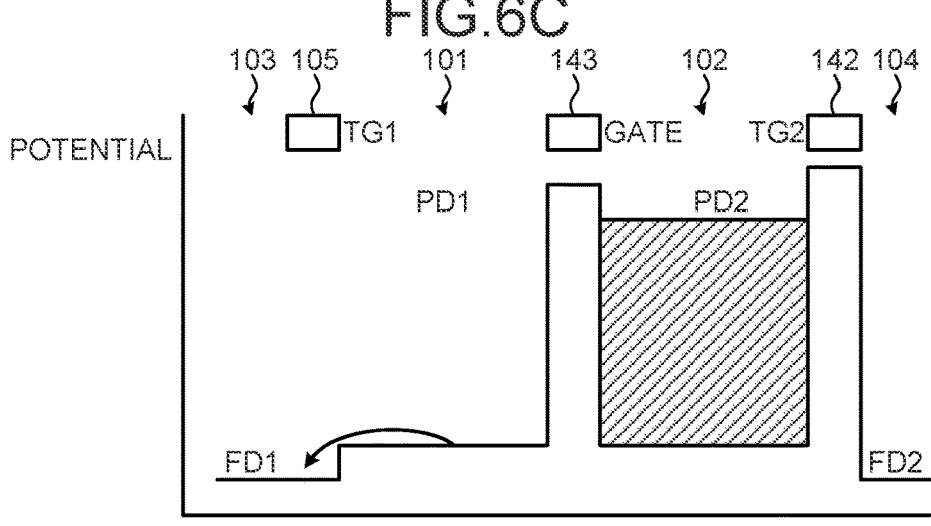
FIG. 6C is a diagram depicting an effect of the overflow gate according to the embodiment of the present disclosure.

FIGS. 6A, 6B, and 6C are diagrams depicting an effect of the overflow gate according to the embodiment of the present disclosure. FIG. 6A is a diagram depicting potential barriers of the photoelectric conversion sections 101 and 102, the charge transfer sections 105 and 106, the charge holding sections 103 and 104, and the overflow path 108 of the pixel 100. The horizontal axis represents the position in the pixel 100, and the vertical axis represents the potential. Note that "FD1", "TG1", "PD1", "GATE", "PD2", "TG2", and "FD2" represent the positions illustrated in FIG. 3.

In the exposure period, a high potential barrier is formed in the charge transfer sections 105 and 106. Thus, charges are accumulated in the photoelectric conversion sections 101 and 102. A hatched rectangle in the drawing represents an accumulated charge. Furthermore, a high gate voltage is applied to the overflow gate 109, and the potential barrier of the overflow path 108 becomes relatively low. Therefore, as illustrated in FIG. 6A, the charge overflowing from the photoelectric conversion section 102 is transferred to the photoelectric conversion section 101 through the overflow path 108. Note that the dotted potential barrier of the overflow path 108 represents a potential barrier in a case where no gate voltage is applied to the overflow gate 109.

FIG. 6B is a diagram depicting the relationship between the charge accumulation time and the charge amount in the image signal mode. In the drawing, the horizontal axis represents the accumulation time, and the vertical axis represents the charge amount. A solid line graph in the drawing is a graph depicting a change in the charge amount of the photoelectric conversion section 102 in FIG. 6A. Furthermore, a graph indicated by an alternate long and short dash line in the drawing is a graph depicting a change in the charge amount of the photoelectric conversion section 101 in FIG. 6A. Furthermore, a dotted line graph in the drawing is a graph representing a charge amount obtained by adding the charges of the photoelectric conversion sections 101 and 102.

In the period of (1) in the drawing, charges are accumulated in the photoelectric conversion sections 101 and 102, and the charge amount increases. The photoelectric conversion section 102 accumulates a larger amount of charges. Thereafter, during the period of (2), the photoelectric conversion section 102 is saturated, and the charge overflows into the photoelectric conversion section 101. While the charge amount of the photoelectric conversion section 102 becomes a constant value, the charge amount accumulated in the photoelectric conversion section 101 increases. Thereafter, in (3), the photoelectric conversion section 101 is also saturated, and the charge amount becomes a constant value. The charge amount obtained by adding the charges of the photoelectric conversion sections 101 and 102 linearly increases in the period of (1) to (2). Even when any of the photoelectric conversion sections 101 and 102 is saturated, linearity of the image signal based on the summed charge can be maintained.

FIG. 6C illustrates a potential barrier in the phase difference signal mode. As described above, in the phase difference signal mode, the charges of the photoelectric conversion sections 101 and 102 are individually transferred to the charge holding sections 103 and 104. This drawing illustrates an example of a case where the charge of the photoelectric conversion section 101 is transferred. By applying the ON signal to the gate electrode of the charge transfer section 105, the potential barrier of the charge transfer section 105 is lowered and the charge is transferred to the charge holding section 103. The potential of the overflow path 108 may be modulated by the voltage applied to the gate electrode, and the potential barrier of the overflow path 108 may be lowered. Accordingly, a negative gate voltage is applied to the overflow gate 109 to prevent a decrease in the potential barrier of the overflow path 108, and transfer of charges from the photoelectric conversion section 102 to the photoelectric conversion section 101 can be prevented. Such adjustment of the gate voltage is performed by the vertical drive circuit 3.

[Method of Manufacturing Imaging Element]

FIGS. 7A to 7D are views depicting an example of the method of manufacturing the imaging element according to the first embodiment of the present disclosure. FIGS. 7A to 7D are views depicting an example of a manufacturing process of a portion of the pixel 100 in the imaging element 1.

Figure 7A:
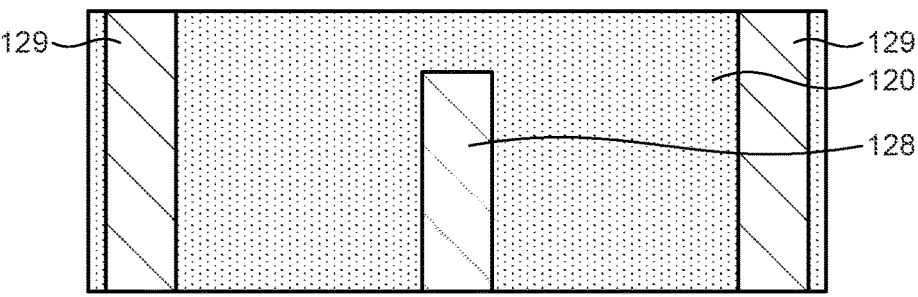
FIG. 7A is a view depicting an example of a method of manufacturing the imaging element according to the first embodiment of the present disclosure.

First, a well region is formed in the semiconductor substrate 120, and the intra-pixel separator 128 and the pixel separator 129 are formed (FIG. 7A). This can be performed by ion implantation of impurities. At this time, in the ion implantation, an acceptor impurity is implanted for making the p-type conductivity that is the same conductivity type as the well region.

Figure 7B:
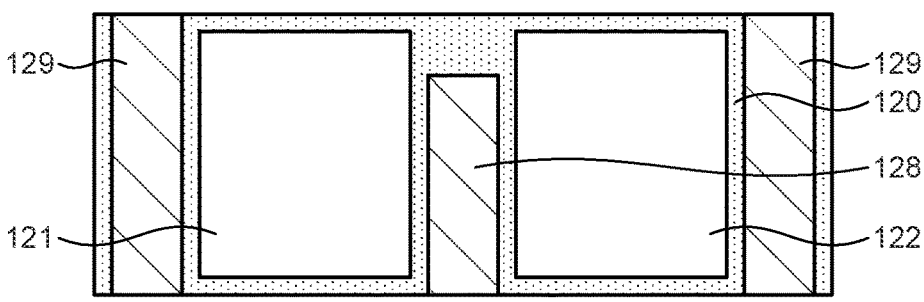
FIG. 7B is a view depicting an example of the method of manufacturing the imaging element according to the first embodiment of the present disclosure.

Next, the photoelectric conversion section 101 and the like are formed on the semiconductor substrate 120. Specifically, the n-type semiconductor regions 121 and 122 and the like are formed in the semiconductor substrate 120. This can be performed by ion implantation of impurities (FIG. 7B).

Figure 7C:
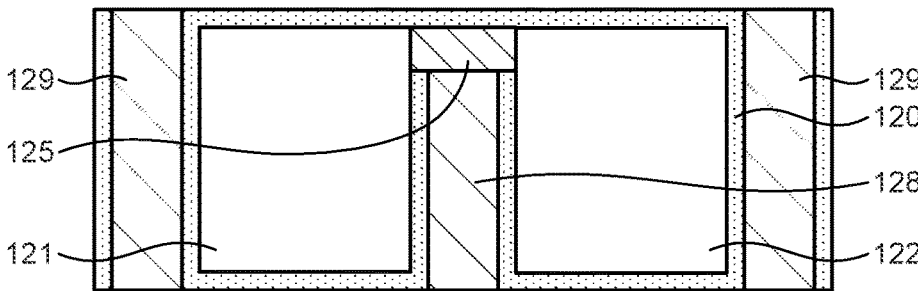
FIG. 7C is a view depicting an example of the method of manufacturing the imaging element according to the first embodiment of the present disclosure.

Next, the semiconductor region 125 forming the overflow path 108 is formed in the semiconductor substrate 120. This can be performed by ion implantation of impurities (FIG. 7C).

Figure 7D:
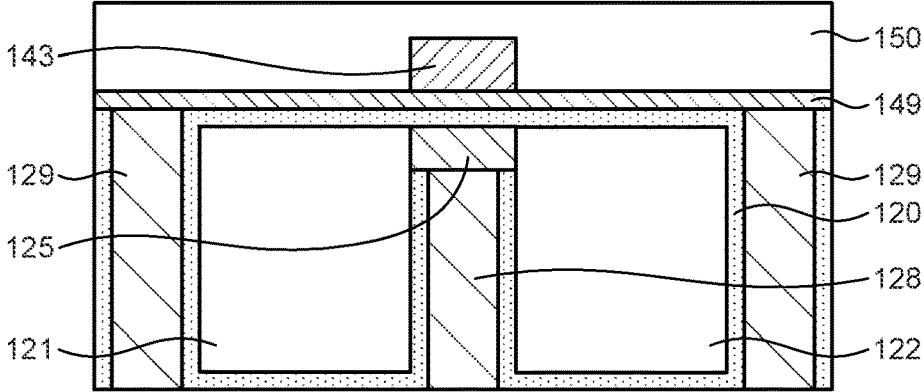
FIG. 7D is a view depicting an example of the method of manufacturing the imaging element according to the first embodiment of the present disclosure.

Next, the insulating film 149 is formed on the front surface side of the semiconductor substrate 120, and the gate electrode 143 constituting the overflow gate 109 is disposed. Next, the wiring region 150 is formed on the front surface side of the semiconductor substrate 120 (FIG. 7D).

Next, the back surface side of the semiconductor substrate 120 is ground to be thinned. Next, the pixel 100 can be manufactured by disposing the insulating film 191, the color filter 192, and the on-chip lens 193 on the back surface side of the semiconductor substrate 120.

[Measurement of Gate Voltage]

Figure 8:
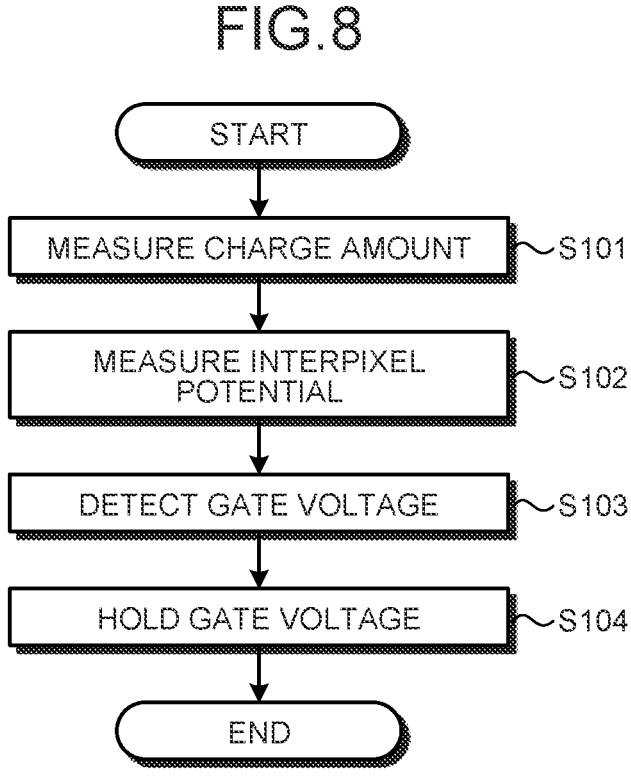
FIG. 8 is a diagram depicting an example of measurement of a gate voltage of the overflow gate according to the first embodiment of the present disclosure.

FIG. 8 is a diagram depicting an example of measurement of the gate voltage of the overflow gate according to the first embodiment of the present disclosure. FIG. 8 is a flowchart depicting an example of measurement of the gate voltage of the overflow gate 109 in the manufacturing process of the imaging element 1. First, the charge amount is measured for each of the photoelectric conversion sections 101 and 102 of the pixel 100 of the manufactured imaging element 1 (Step S101). This can be performed by measuring Qs of the photoelectric conversion sections 101 and 102. Next, an interpixel potential is measured (Step S102). This can be done by measuring the potential between the pixels 100. Next, a gate voltage is detected (Step S103). This can be performed by detecting the voltage of the overflow gate 109 for obtaining desired characteristics on the basis of Qs, an interpixel potential, and the like. Next, the gate voltage is held (Step S104). This can be performed by holding the detected gate voltage in a holding unit such as a register disposed in the imaging element 1.

By applying the gate voltage read from the register to the overflow gate 109 when the imaging element 1 is used, desired characteristics can be obtained.

As described above, in the pixel 100 of the present disclosure, the overflow gate 109 is disposed adjacent to the overflow path 108 disposed between the plurality of photoelectric conversion sections 101 and 102, and the applied voltage of the overflow gate 109 is adjusted. Thus, the potential barrier of the overflow path 108 can be adjusted, the linearity of the image signal can be improved, and the phase difference detectable range when the phase difference signal is generated can be widened. The convenience can be improved.

2. Second Embodiment

In the imaging element 1 of the first embodiment described above, the pixel separator 129 formed by the semiconductor region is disposed at the boundary of the pixels 100. On the other hand, the imaging element 1 according to a second embodiment of the present disclosure is different from the above-described first embodiment in that a pixel separator including an insulator is disposed.
[Configuration of Imaging Element]

Figure 9:
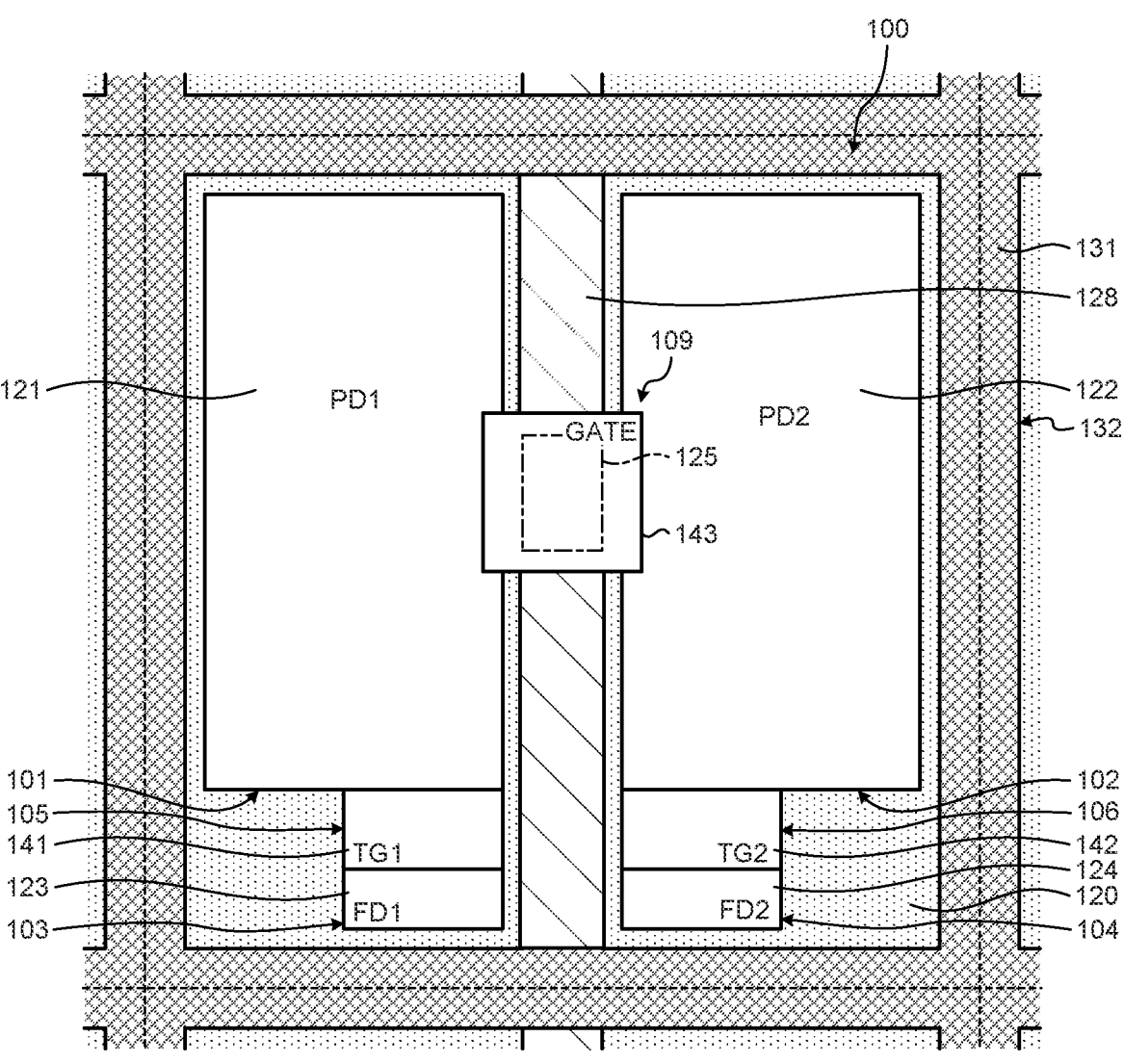
FIG. 9 is a view depicting a configuration example of a pixel according to a second embodiment of the present disclosure.

FIG. 9 is a view depicting a configuration example of the pixel 100 according to the second embodiment of the present disclosure. The drawing is a plan view depicting the configuration example of the imaging element 1, as in FIG. 3. The pixel 100 in the drawing is different from the pixel 100 in FIG. 3 in including a pixel separator 131 instead of the pixel separator 129.

The pixel separator 131 is a pixel separator formed by embedding an insulating member in the semiconductor substrate 120. The pixel separator 131 can be formed by embedding a film of an insulator such as SiO$_2$ in a trench 132 formed in the semiconductor substrate 120.
[Configuration of Cross-Section of Imaging Element]

Figure 10A:
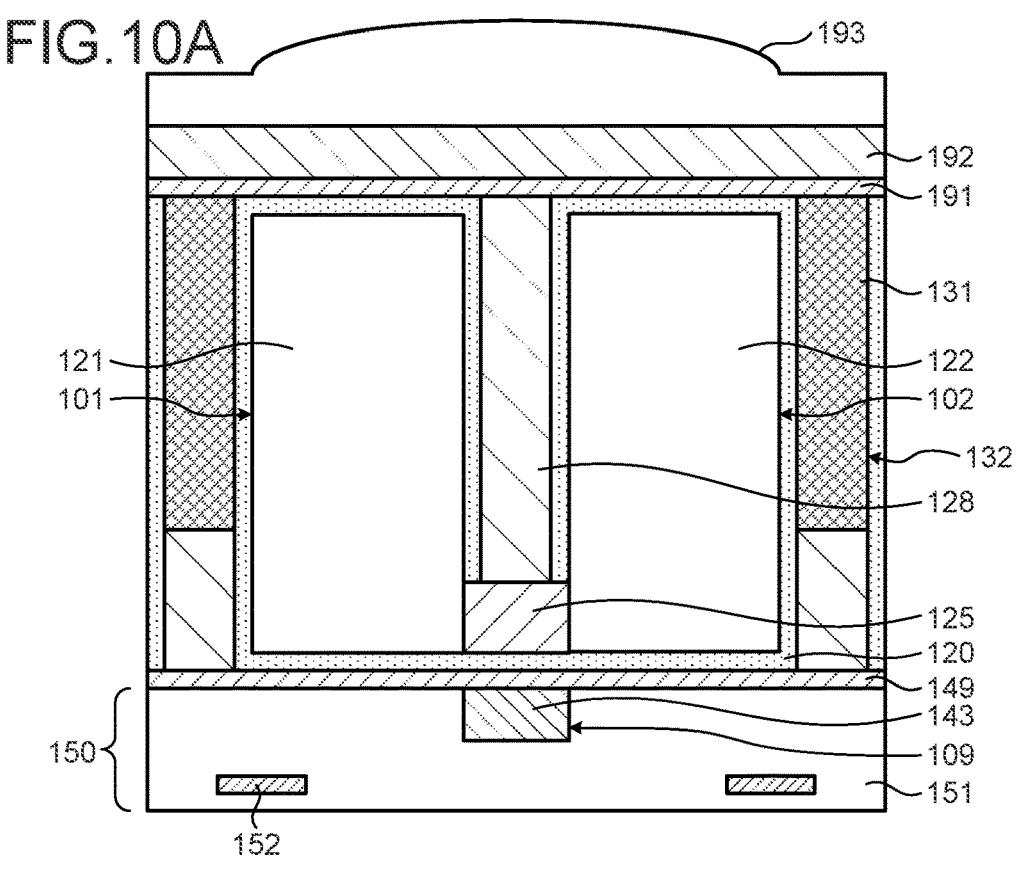
FIG. 10A is a cross-sectional view depicting the configuration example of the pixel according to the second embodiment of the present disclosure.
Figure 10B:
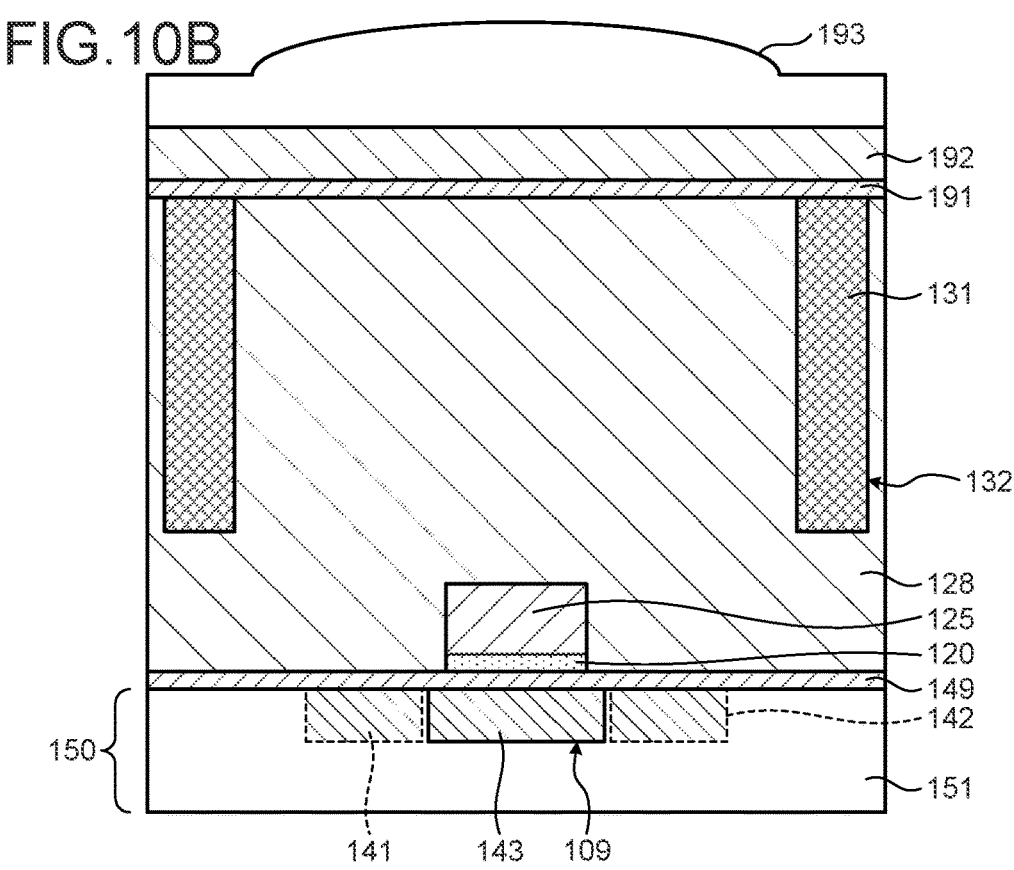
FIG. 10B is a cross-sectional view depicting the configuration example of the pixel according to the second embodiment of the present disclosure.

FIGS. 10A and 10B are cross-sectional views depicting the configuration example of the pixel according to the second embodiment of the present disclosure. FIGS. 10A and 10B are cross-sectional views depicting the configuration example of the pixel 100 as in FIGS. 4A and 4B. The pixel 100 in FIGS. 10A and 10B is different from the pixel 100 in FIGS. 4A and 4B in that the pixel separator 131 is disposed instead of the pixel separator 129. The pixel separator 131 can be formed by disposing an insulator film in the trench 132 formed from the back surface side of the semiconductor substrate 120 at the boundary of the pixel 100.
[Method of Manufacturing Imaging Element]

Figure 11A:
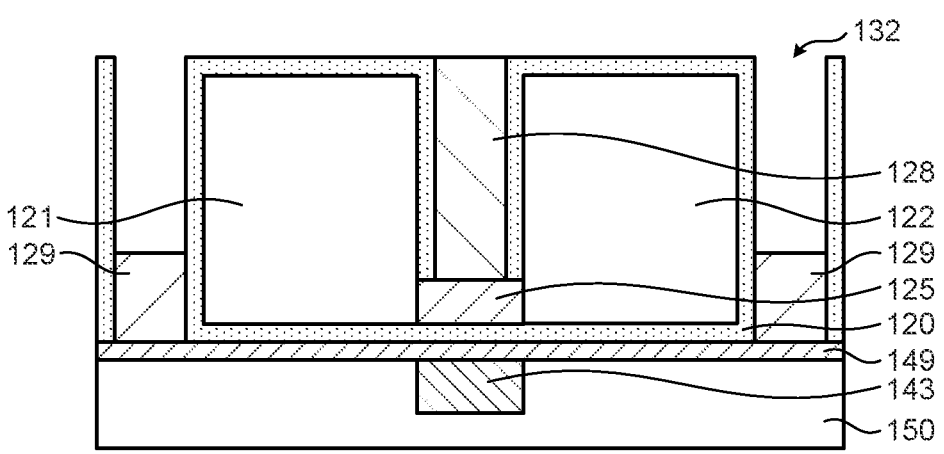
FIG. 11A is a view depicting an example of a method of manufacturing the imaging element according to the second embodiment of the present disclosure.
Figure 11B:
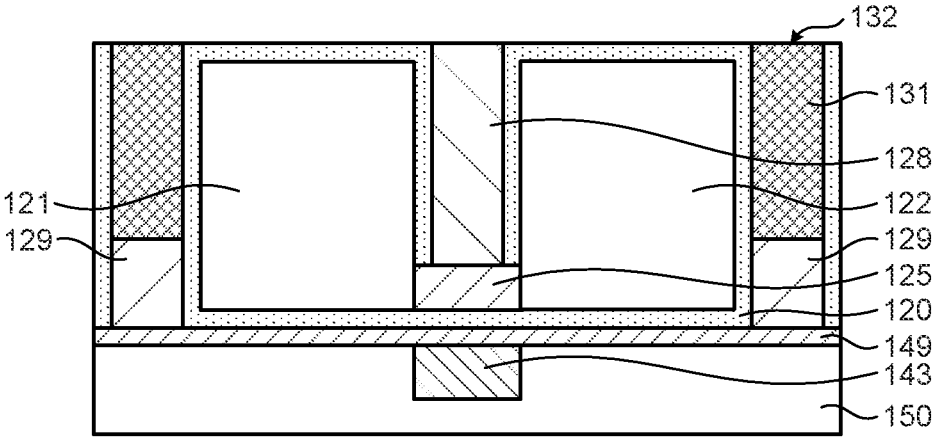
FIG. 11B is a view depicting an example of the method of manufacturing the imaging element according to the second embodiment of the present disclosure.

FIGS. 11A and 11B are views depicting an example of a method of manufacturing the imaging element according to the second embodiment of the present disclosure. FIGS. 11A and 11B are views depicting an example of a manufacturing process of a portion of the pixel 100 in the imaging element 1. First, the process of FIGS. 7A to 7D is executed. Next, the top and bottom of the imaging element 1 are inverted, and the trench 132 is formed from the back surface side of the semiconductor substrate 120 (FIG. 11A). This can be performed by, for example, dry etching.

Next, an insulating member such as SiO$_2$ is disposed in the trench 132. This can be performed, for example, by CVD (FIG. 11B). Thus, the pixel separator 131 can be formed.

The configuration of the imaging element 1 other than this is similar to the configuration of the imaging element 1 in the first embodiment of the present disclosure, and thus description thereof is omitted.

As described above, in the imaging element 1 according to the second embodiment of the present disclosure, the pixel separator 131 including the insulating member is disposed, so that the insulating property between the pixels 100 can be improved.

3. Third Embodiment

In the imaging element 1 of the second embodiment described above, the pixel separator 131 in which an insulator is embedded in the trench 132 formed from the back surface side of the semiconductor substrate 120 is disposed at the boundary of the pixels 100. On the other hand, the imaging element 1 according to a third embodiment of the present disclosure is different from the above-described second embodiment in that a pixel separator formed by embedding an insulator in a trench formed from a surface of the semiconductor substrate 120 is disposed.
[Configuration of Imaging Element]

Figure 12:
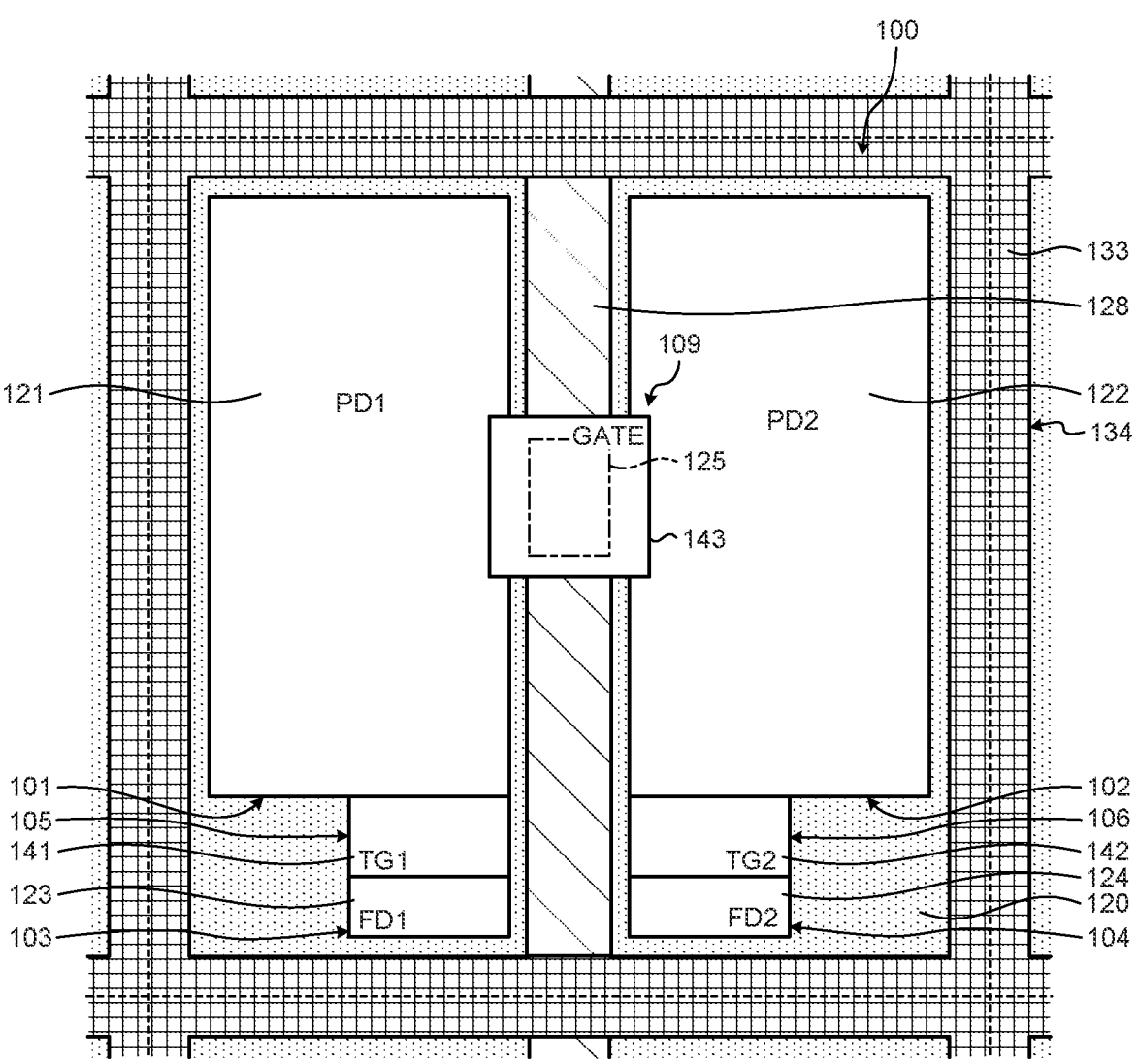
FIG. 12 is a view depicting a configuration example of a pixel according to a third embodiment of the present disclosure.

FIG. 12 is a view depicting a configuration example of the pixel 100 according to the third embodiment of the present disclosure. The drawing is a plan view depicting the configuration example of the imaging element 1, as in FIG. 9. The pixel 100 in the drawing is different from the pixel 100 in FIG. 9 in including a pixel separator 133 instead of the pixel separator 131.

The pixel separator 133 is a pixel separator formed by embedding an insulating member in the semiconductor substrate 120. The pixel separator 133 can be formed by embedding a film of an insulator such as SiO$_2$ in a trench 134 formed in the semiconductor substrate 120.
[Configuration of Cross-Section of Imaging Element]

Figure 13A:
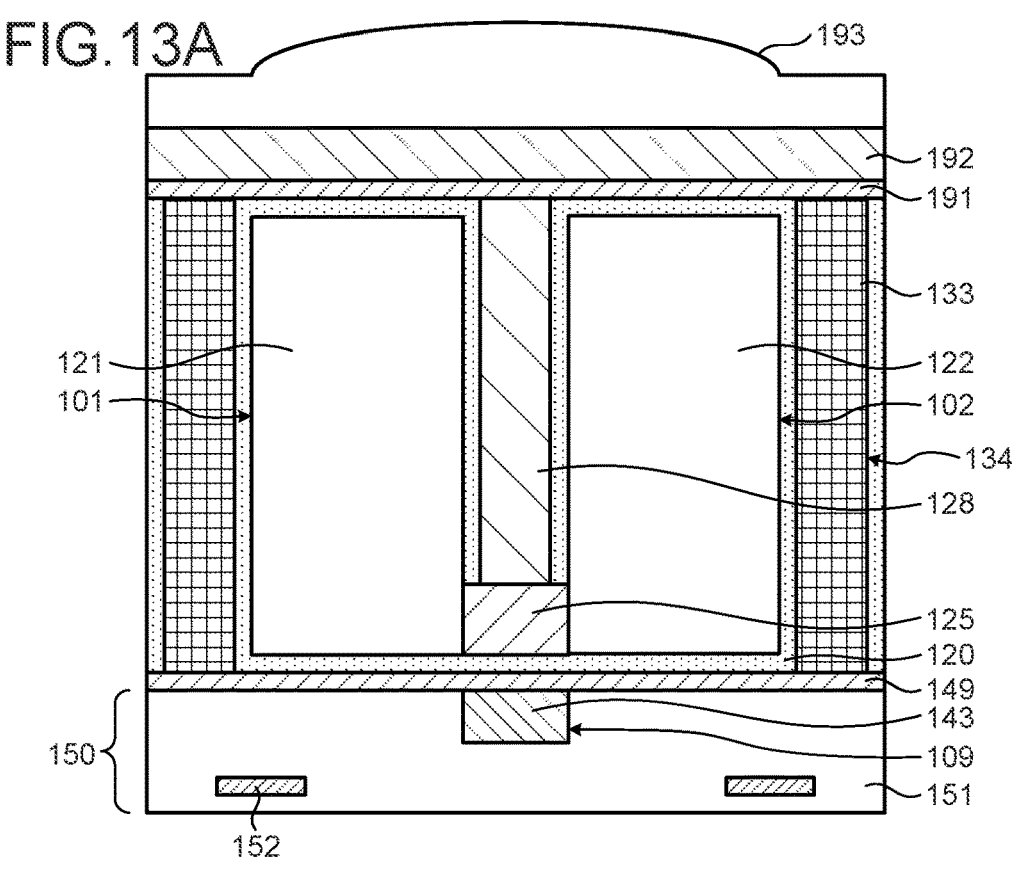
FIG. 13A is a cross-sectional view depicting the configuration example of the pixel according to the third embodiment of the present disclosure.
Figure 13B:
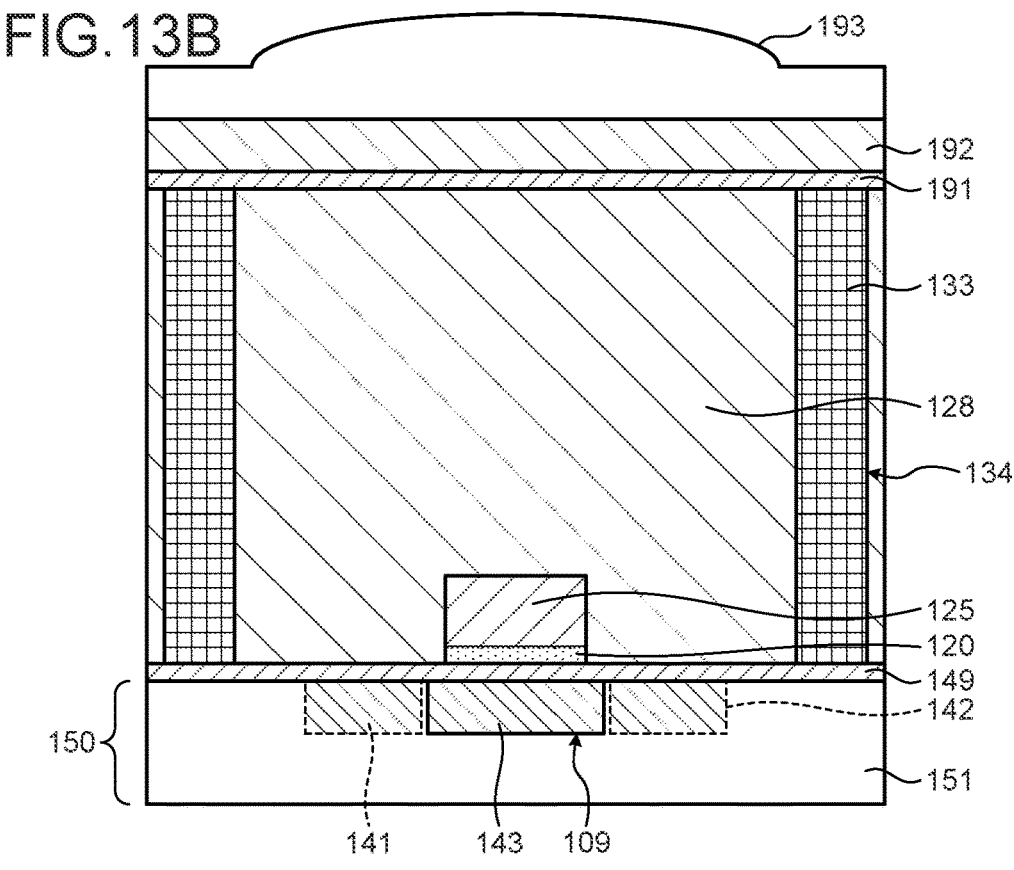
FIG. 13B is a cross-sectional view depicting the configuration example of the pixel according to the third embodiment of the present disclosure.

FIGS. 13A and 13B are cross-sectional views depicting the configuration example of the pixel according to a third embodiment of the present disclosure. FIGS. 13A and 13B are cross-sectional views depicting the configuration example of the pixel 100 as in FIGS. 10A and 10B. The pixel 100 in FIGS. 13A and 13B is different from the pixel 100 in FIGS. 10A and 10B in that the pixel separator 133 is disposed instead of the pixel separator 131. As illustrated in the drawing, the pixel separator 133 is formed in a shape penetrating the semiconductor substrate 120. Furthermore, the trench 134 is a trench formed from the surface of the semiconductor substrate 120 at the boundary of the pixel 100. The pixel separator 133 can be formed by disposing an insulator film in the trench 134.
[Method of Manufacturing Imaging Element]

Figure 14A:
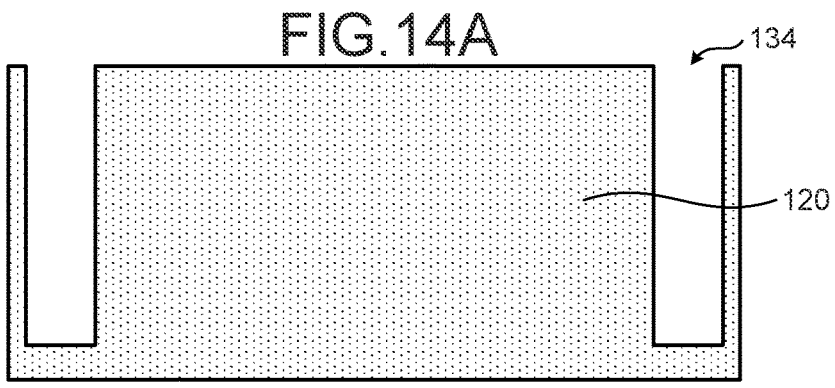
FIG. 14A is a view depicting an example of a method of manufacturing an imaging element according to a third embodiment of the present disclosure.
Figure 14B:
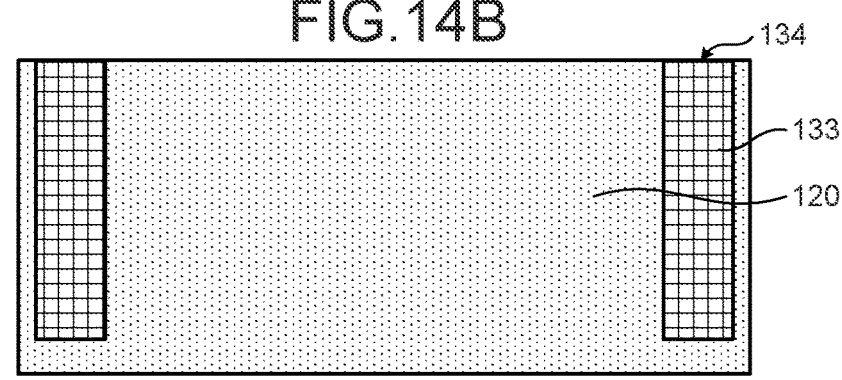
FIG. 14B is a view depicting an example of the method of manufacturing the imaging element according to the third embodiment of the present disclosure.
Figure 14C:
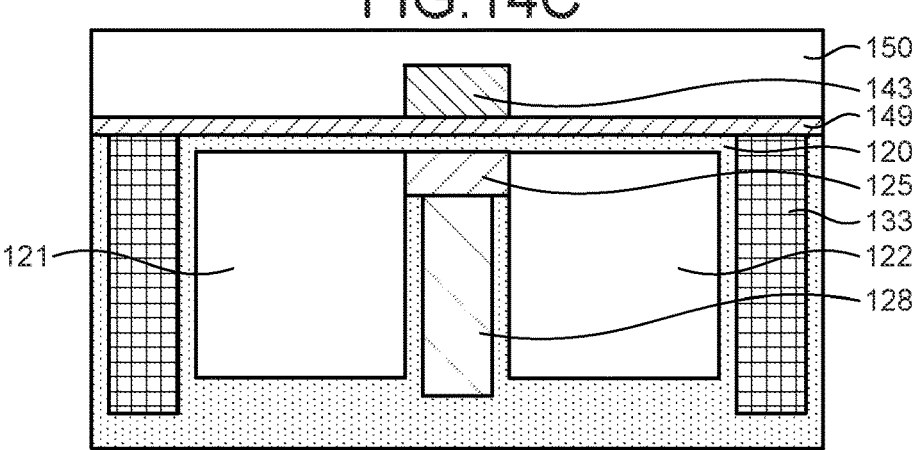
FIG. 14C is a view depicting an example of the method of manufacturing the imaging element according to the third embodiment of the present disclosure.
Figure 14D:
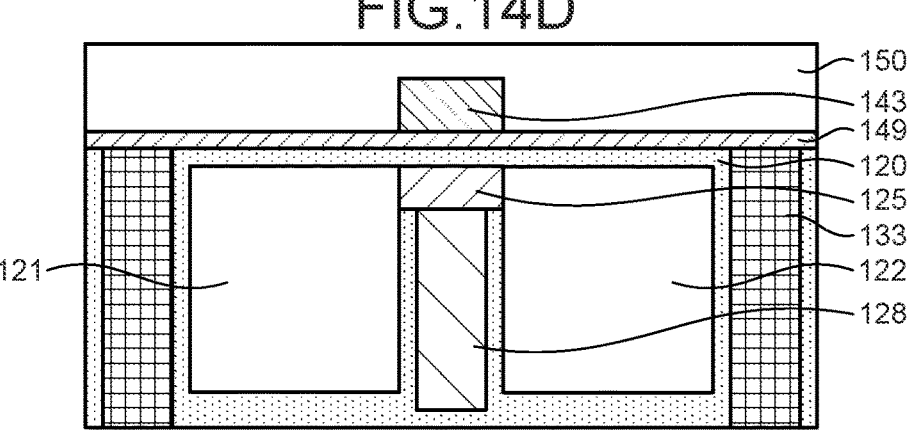
FIG. 14D is a view depicting an example of the method of manufacturing the imaging element according to the third embodiment of the present disclosure.

FIGS. 14A and 14D are views depicting an example of a method of manufacturing the imaging element according to the third embodiment of the present disclosure. FIGS. 14A and 14D are views depicting an example of a manufacturing process of a portion of the pixel 100 in the imaging element 1. First, the trench 134 is formed on the front surface side of the semiconductor substrate 120 (FIG. 14A). This can be performed by dry etching.

Next, the pixel separator 133 is formed by embedding a film of an insulator such as SiO₂ in the trench 134 (FIG. 14B).

Next, the intra-pixel separator 128, the semiconductor regions 121 and 122, the semiconductor region 125, the insulating film 149, the gate electrode 143, and the wiring region 150 are formed (FIG. 14C).

Next, the back surface side of the semiconductor substrate 120 is ground to be thinned (FIG. 14D). Thus, the pixel separator 133 having a shape penetrating the semiconductor substrate 120 can be formed.

The configuration of the imaging element 1 other than this is similar to the configuration of the imaging element 1 in the second embodiment of the present disclosure, and thus description thereof is omitted.

As described above, the imaging element 1 according to the third embodiment of the present disclosure includes the pixel separator 133 having a shape penetrating the semiconductor substrate 120. Thus, insulation characteristics between the pixels 100 on the front surface side of the semiconductor substrate 120 can be further improved.

4. Fourth Embodiment

In the imaging element 1 of the second embodiment described above, the pixel separator 131 is disposed at the boundary of the pixels 100. On the other hand, the imaging element 1 according to a fourth embodiment of the present disclosure is different from the above-described second embodiment in that a separator formed by an insulator is further disposed between photoelectric conversion sections 101 and 102 of a pixel 100.

[Configuration of Imaging Element]

Figure 15:
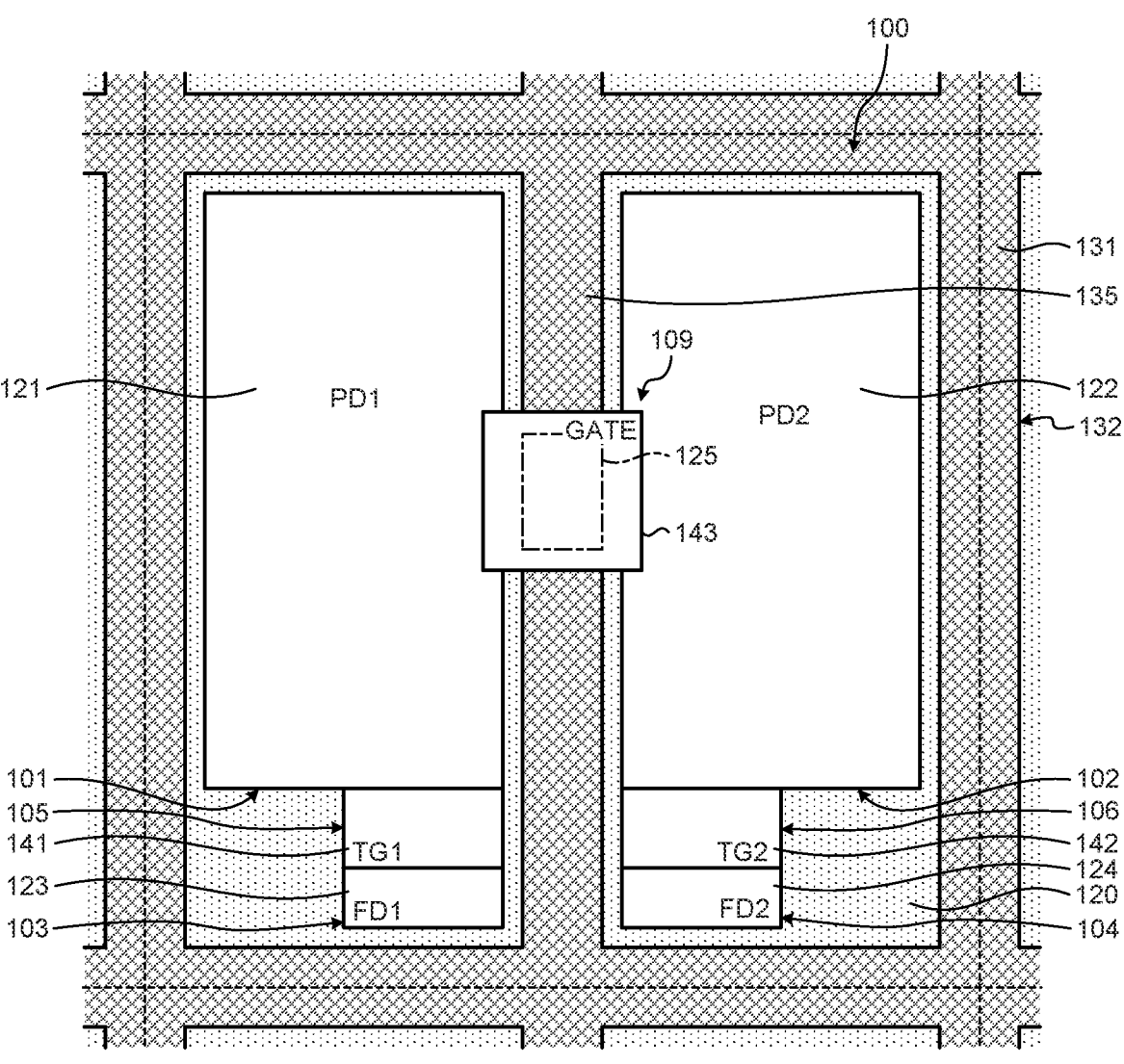
FIG. 15 is a view depicting a configuration example of a pixel according to a fourth embodiment of the present disclosure.

FIG. 15 is a view depicting a configuration example of the pixel 100 according to the fourth embodiment of the present disclosure. The drawing is a plan view depicting the configuration example of the imaging element 1, as in FIG. 9. The pixel 100 in the drawing is different from the pixel 100 in FIG. 9 in further including an intra-pixel separator 135.

The intra-pixel separator 135 is a separation portion disposed between the photoelectric conversion sections 101 and 102, and is a separation portion formed by embedding an insulating member in a trench formed in the semiconductor substrate 120. The trench 134 in the drawing is also formed between the photoelectric conversion sections 101 and 102 in addition to the boundary between the pixels 100. The intra-pixel separator 135 can be formed by embedding an insulator film similar to that of the pixel separator 131 in the trench 134 between the photoelectric conversion sections 101 and 102.

[Configuration of Cross-Section of Imaging Element]

Figure 16A:
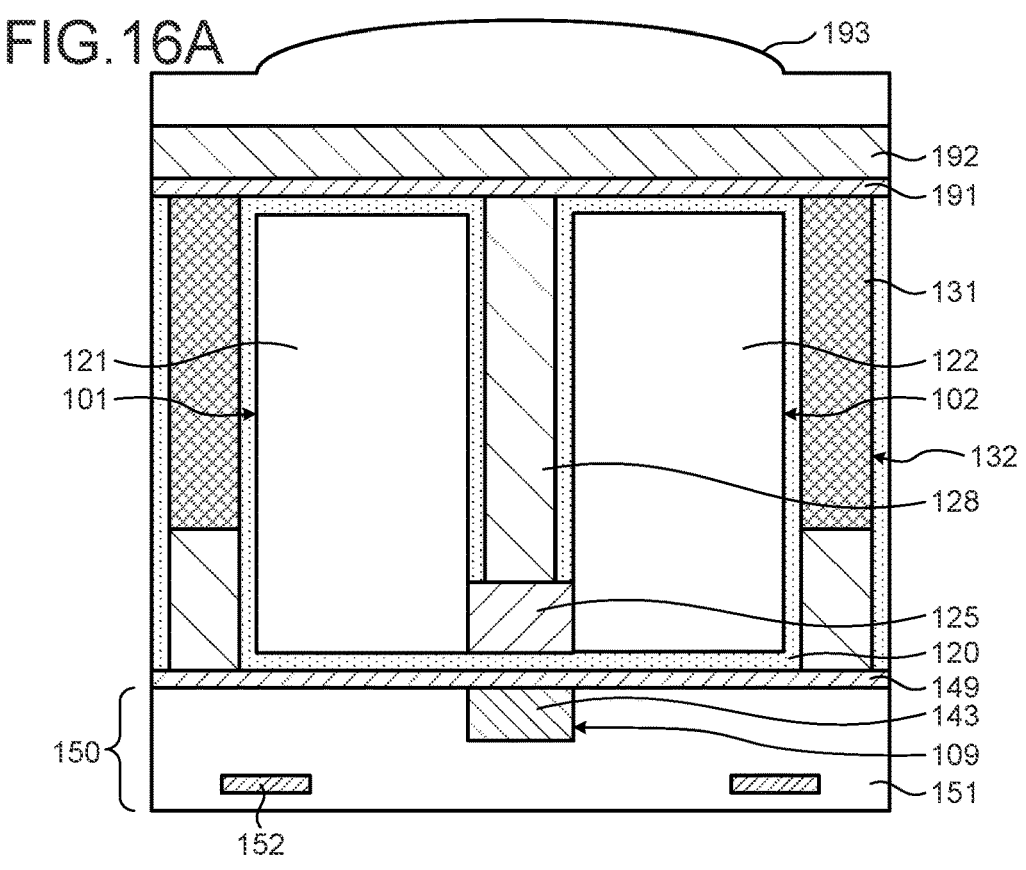
FIG. 16A is a cross-sectional view depicting the configuration example of the pixel according to the fourth embodiment of the present disclosure.
Figure 16B:
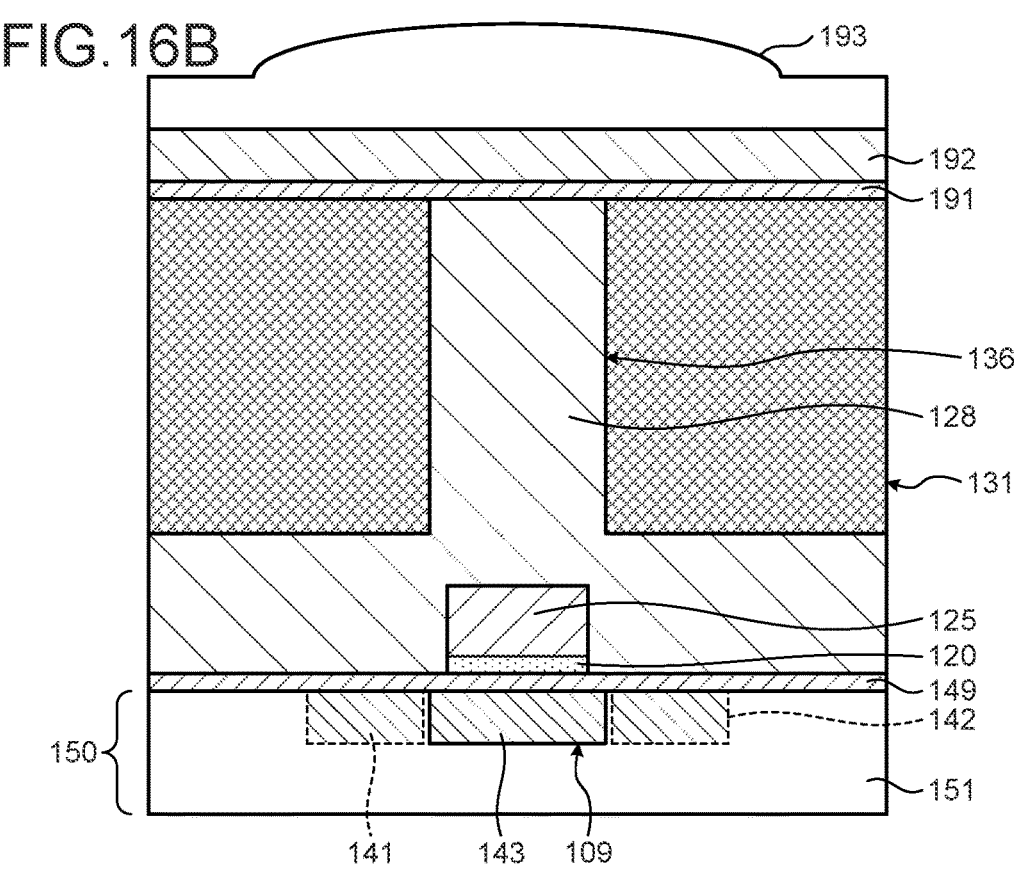
FIG. 16B is a cross-sectional view depicting the configuration example of the pixel according to the fourth embodiment of the present disclosure.

FIGS. 16A and 16B are cross-sectional views depicting the configuration example of the pixel according to a fourth embodiment of the present disclosure. FIGS. 16A and 16B are cross-sectional views depicting the configuration example of the pixel 100 as in FIGS. 10A and 10B. The pixel 100 in FIGS. 16A and 16B is different from the pixel 100 in FIGS. 10A and 10B in further including an intra-pixel separator 135. As illustrated in the drawing, the intra-pixel separator 128 is disposed on the semiconductor substrate 120 below the overflow path 108. Note that the intra-pixel separator 128 is an example of a second intra-pixel separator described in the claims.

[Another Configuration of Imaging Element]

Figure 17:
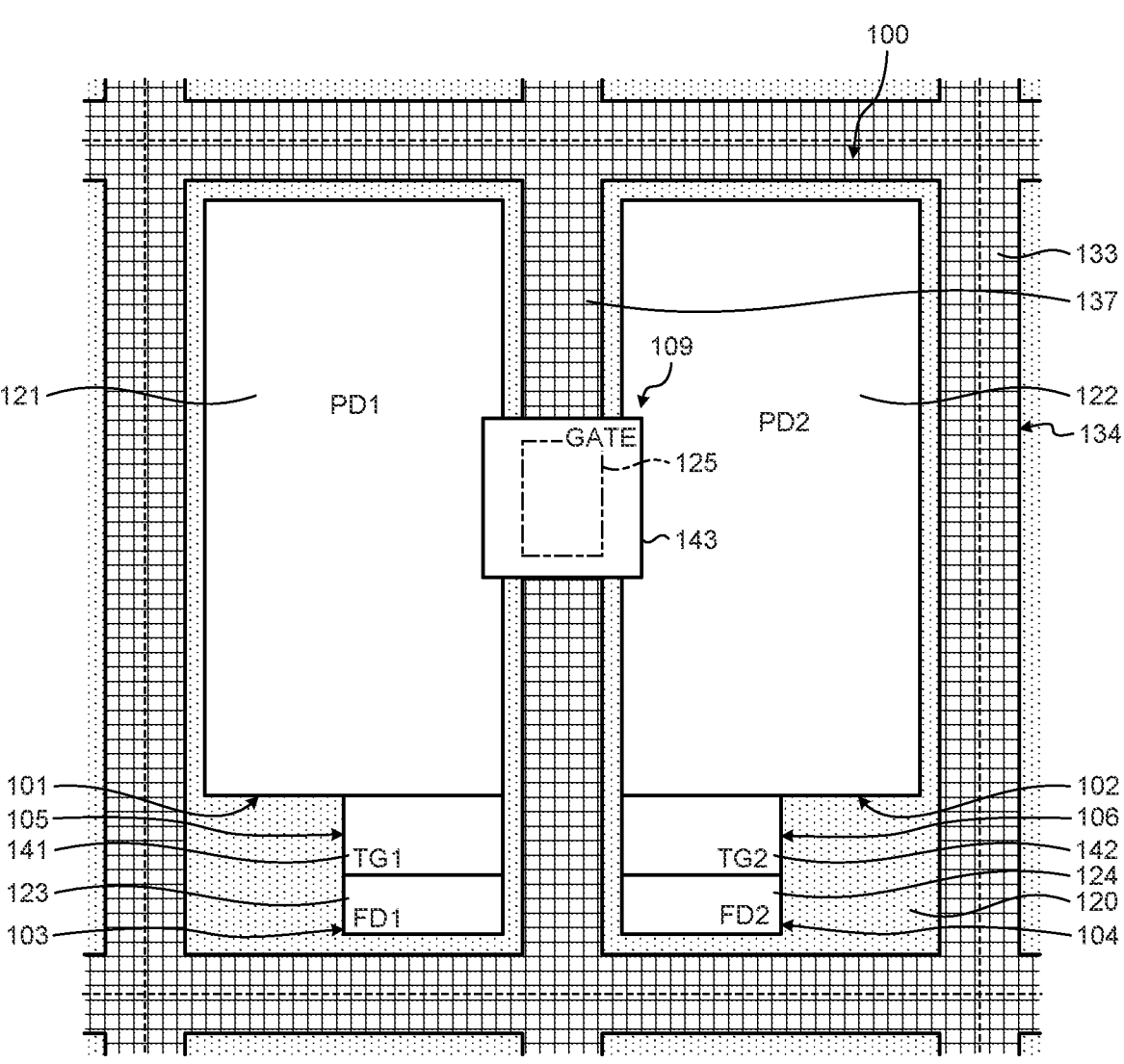
FIG. 17 is a view depicting another configuration example of the pixel according to the fourth embodiment of the present disclosure.

FIG. 17 is a view depicting another configuration example of the pixel 100 according to the fourth embodiment of the present disclosure. The drawing is a plan view depicting the configuration example of the imaging element 1, as in FIG. 16. The pixel 100 in the drawing is different from the pixel 100 in FIG. 16 in including the pixel separator 133 and an intra-pixel separator 137 instead of the pixel separator 131 and the intra-pixel separator 135.

Similarly to the pixel separator 133, the intra-pixel separator 137 is a separator having a shape penetrating the semiconductor substrate 120.

[Configuration of Cross-Section of Imaging Element]

Figure 18A:
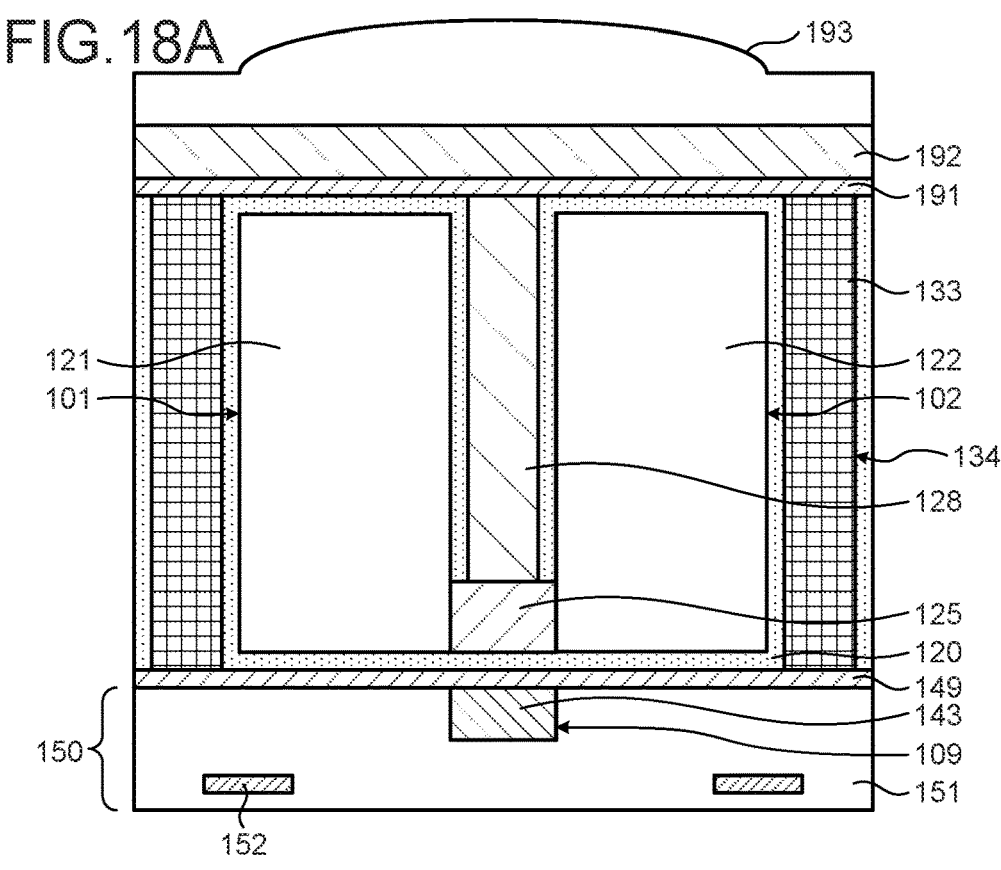
FIG. 18A is a cross-sectional view depicting another configuration example of the pixel according to the fourth embodiment of the present disclosure.
Figure 18B:
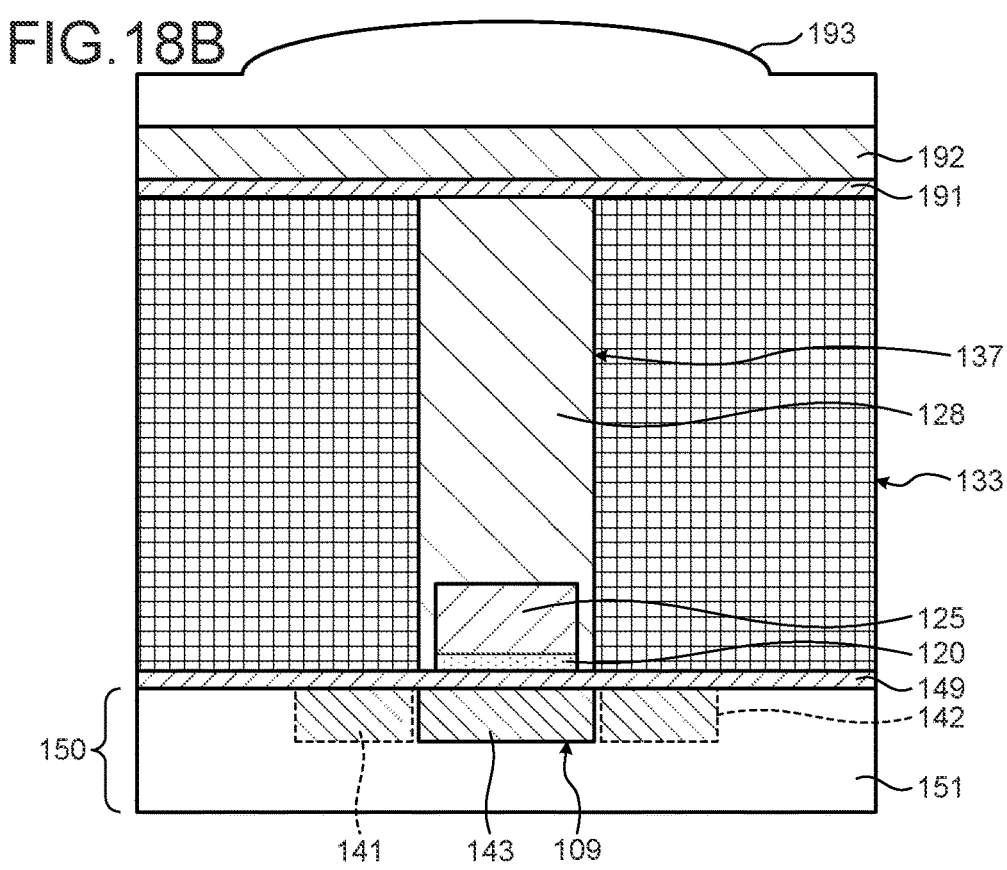
FIG. 18B is a cross-sectional view depicting another configuration example of the pixel according to the fourth embodiment of the present disclosure.

FIGS. 18A and 18B are cross-sectional views depicting another configuration example of the pixel according to the fourth embodiment of the present disclosure. FIGS. 18A and 18B are cross-sectional views depicting the configuration example of the pixel 100 as in FIGS. 10A and 10B. The pixel 100 in FIGS. 18A and 18B is different from the pixel 100 in FIGS. 10A and 10B in including a pixel separator 133 and an intra-pixel separator 137 instead of the pixel separator 131 and the intra-pixel separator 135. The intra-pixel separator 137 is formed in a shape penetrating the semiconductor substrate 120. Furthermore, the intra-pixel separator 128 is disposed on the semiconductor substrate 120 below the overflow path 108.

The configuration of the imaging element 1 other than this is similar to the configuration of the imaging element 1 in the second embodiment of the present disclosure, and thus description thereof is omitted.

As described above, the imaging element 1 according to the fourth embodiment of the present disclosure includes the intra-pixel separators 135 and 137 including an insulating member. This makes it possible to improve insulation characteristics between the photoelectric conversion sections 101 and 102.

5. Fifth Embodiment

In the imaging element 1 of the first embodiment described above, the overflow path 108 and the overflow gate 109 are disposed in the central portion of the pixel 100. On the other hand, the imaging element 1 according to a fifth embodiment of the present disclosure is different from the above-described first embodiment in that the overflow path 108 and the overflow gate 109 are disposed near an end portion of the pixel 100.

[Configuration of Imaging Element]

Figure 19:
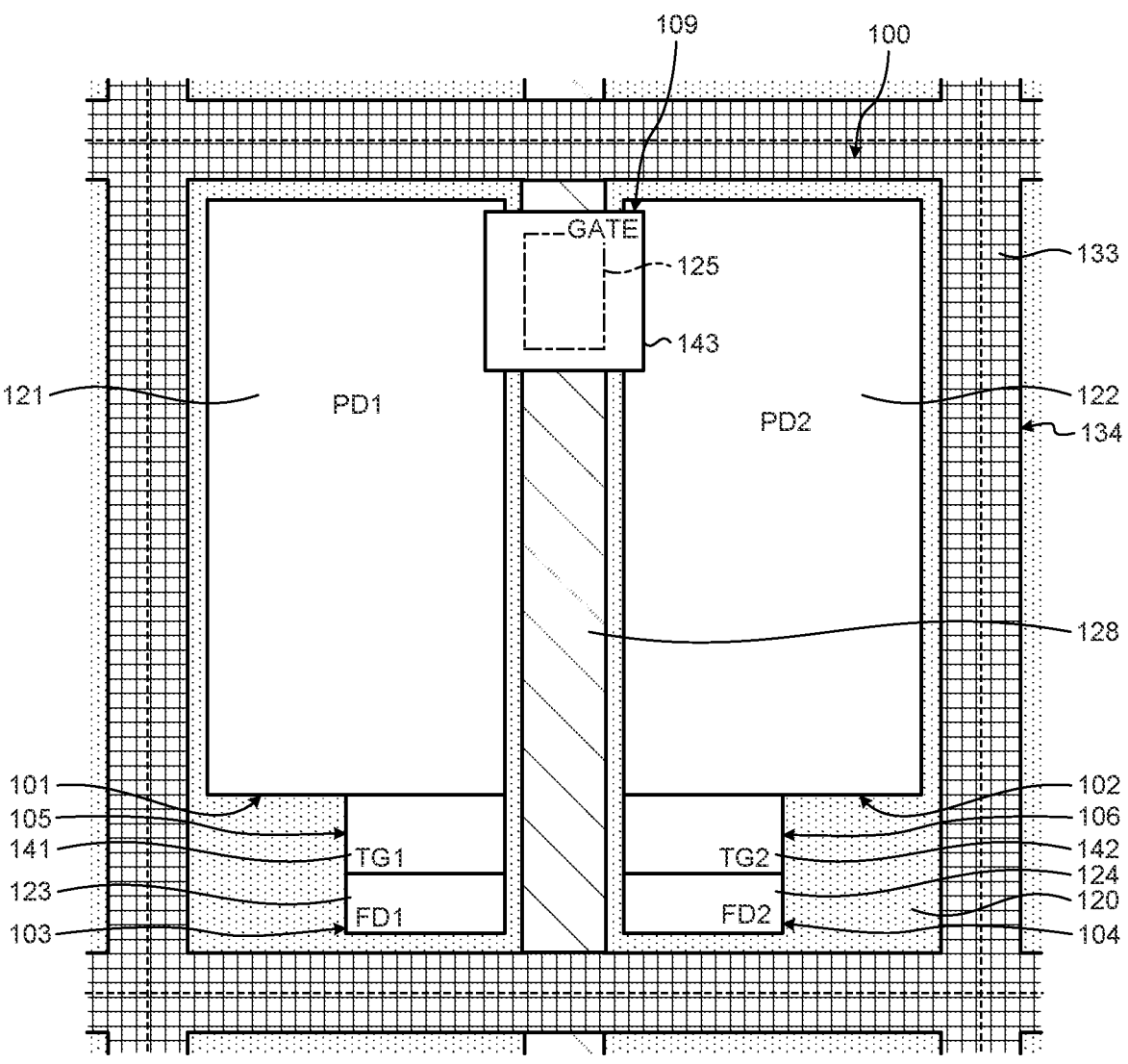
FIG. 19 is a view depicting a configuration example of a pixel according to a fifth embodiment of the present disclosure.

FIG. 19 is a view depicting a configuration example of the pixel 100 according to a fifth embodiment of the present disclosure. The drawing is a plan view depicting the configuration example of the imaging element 1, as in FIG. 3. The pixel 100 in the drawing is different from the pixel 100 in FIG. 3 in that the overflow path 108 and the overflow gate 109 are disposed near an end portion of the pixel 100.

The overflow path 108 and the overflow gate 109 in the drawing are disposed near the end portion of the pixel 100 and disposed apart from the charge transfer sections 105 and 106. That is, the overflow path 108, the overflow gate 109, and the charge transfer sections 105 and 106 are disposed near the boundary of the facing pixel 100. Since the overflow path 108 is disposed apart from the charge transfer sections 105 and 106, it is possible to reduce the modulation of the potential of the overflow path 108 described in FIG. 6C.

The configuration of the imaging element 1 other than this is similar to the configuration of the imaging element 1 in the first embodiment of the present disclosure, and thus description thereof is omitted.

As described above, in the imaging element 1 according to the fifth embodiment of the present disclosure, since the overflow path 108 is disposed apart from the charge transfer sections 105 and 106, it is possible to reduce the influence of the gate voltages of the charge transfer sections 105 and 106 on the overflow path 108.

6. Sixth Embodiment

In the imaging element 1 of the above-described fourth embodiment, the overflow gate 109 is disposed on the front surface side of the semiconductor substrate 120. On the other hand, the imaging element 1 according to a sixth embodiment of the present disclosure is different from the above-described fourth embodiment in that an overflow gate embedded in the semiconductor substrate 120 is disposed.

[Configuration of Imaging Element]

Figure 20:
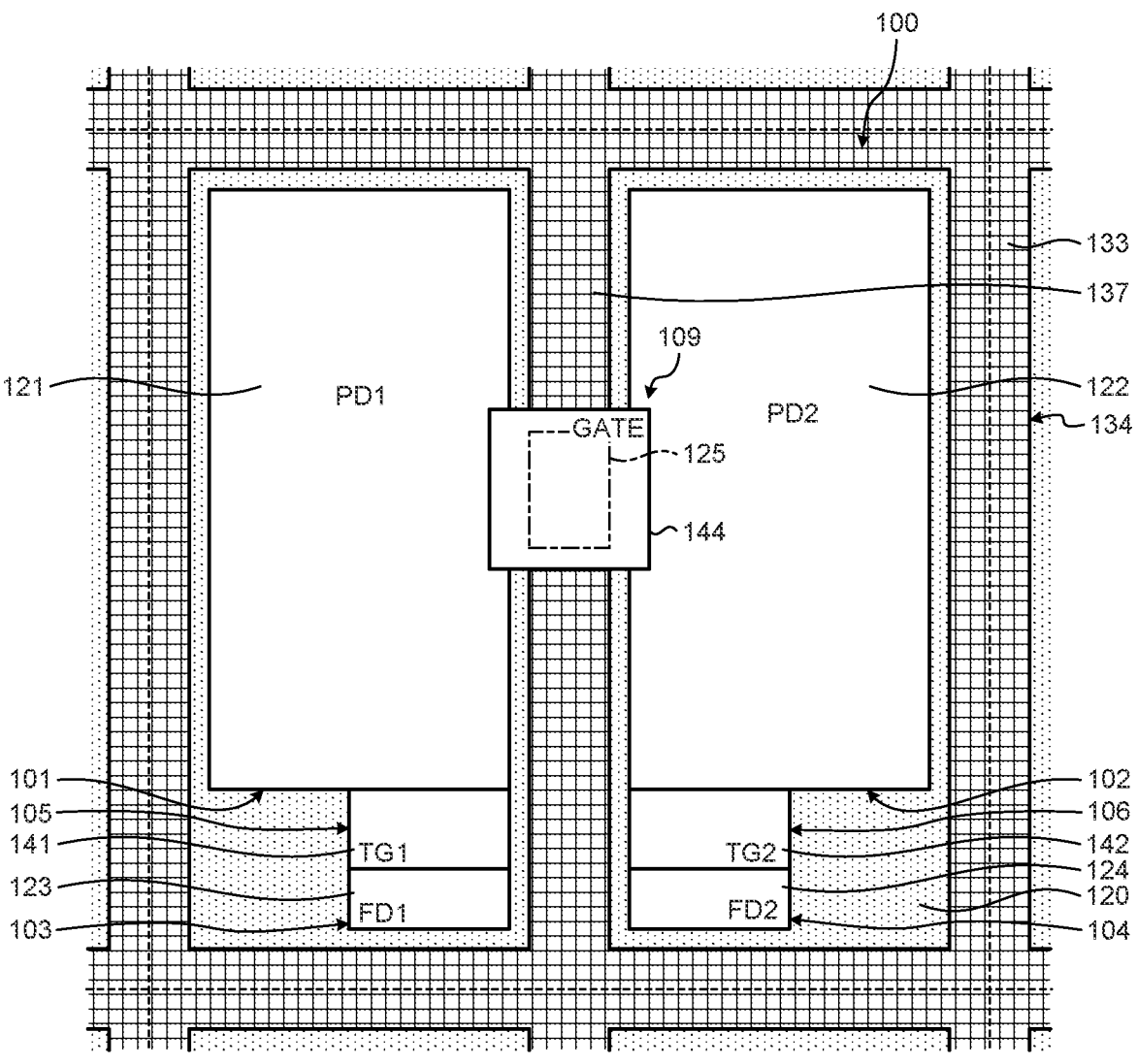
FIG. 20 is a view depicting a configuration example of a pixel according to a sixth embodiment of the present disclosure.

FIG. 20 is a view depicting a configuration example of the pixel 100 according to a sixth embodiment of the present disclosure. The drawing is a plan view depicting the configuration example of the imaging element 1, as in FIG. 17. The pixel 100 in the drawing is different from the pixel 100 in FIG. 17 in including the overflow gate 109 including a gate electrode 144.

The overflow gate 109 in the drawing includes the gate electrode 144. The gate electrode 144 is a gate electrode at least partially embedded in the semiconductor substrate 120.

[Configuration of Cross-Section of Imaging Element]

Figure 21A:
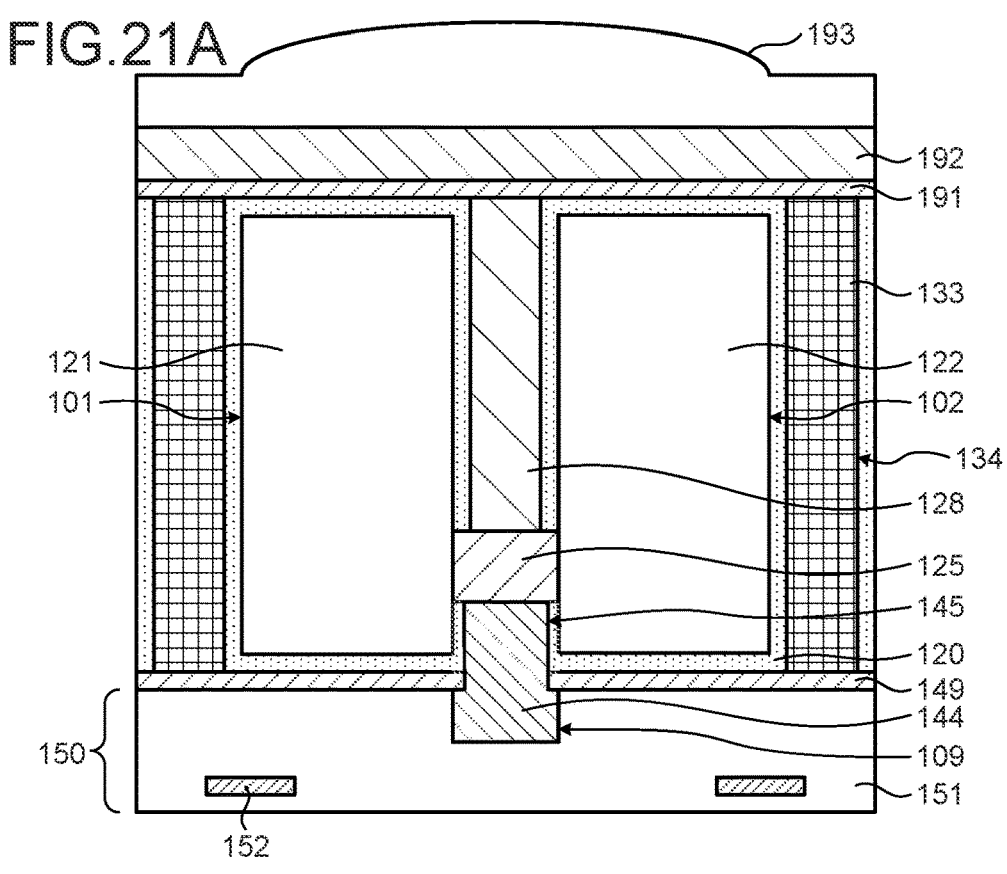
FIG. 21A is a cross-sectional view depicting the configuration example of the pixel according to the sixth embodiment of the present disclosure.
Figure 21B:
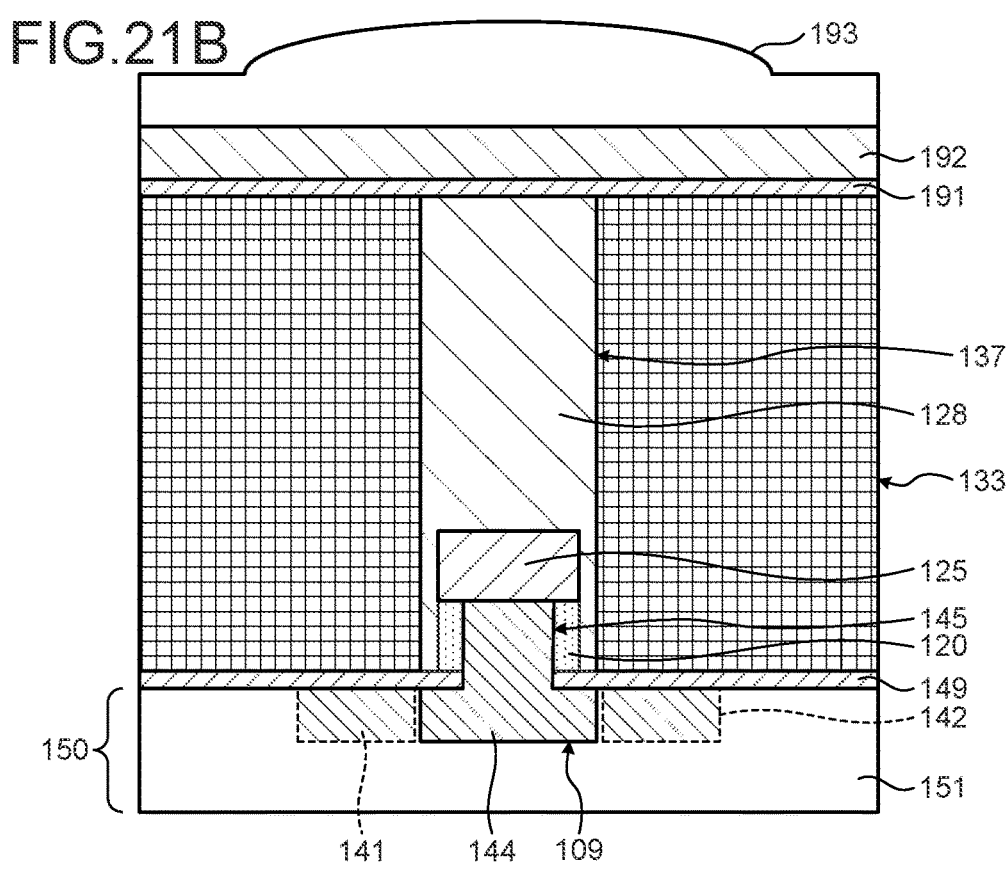
FIG. 21B is a cross-sectional view depicting the configuration example of the pixel according to the sixth embodiment of the present disclosure.

FIGS. 21A and 21B are cross-sectional views depicting the configuration example of the pixel according to a sixth embodiment of the present disclosure. FIGS. 21A and 21B are cross-sectional views depicting the configuration example of the pixel 100 as in FIGS. 18A and 18B. The pixel 100 in FIGS. 21A and 21B is different from the pixel 100 in FIGS. 18A and 18B in that the overflow gate 109 including the gate electrode 144 is disposed instead of the gate electrode 143. As illustrated in the drawing, the gate electrode 144 has a lower portion embedded in the semiconductor substrate 120. In addition, the overflow path 108 in the drawing can be disposed below the gate electrode 144. The overflow path 108 can be apart from the charge transfer sections 105 and 106.

[Method of Manufacturing Imaging Element]

Figure 22E:
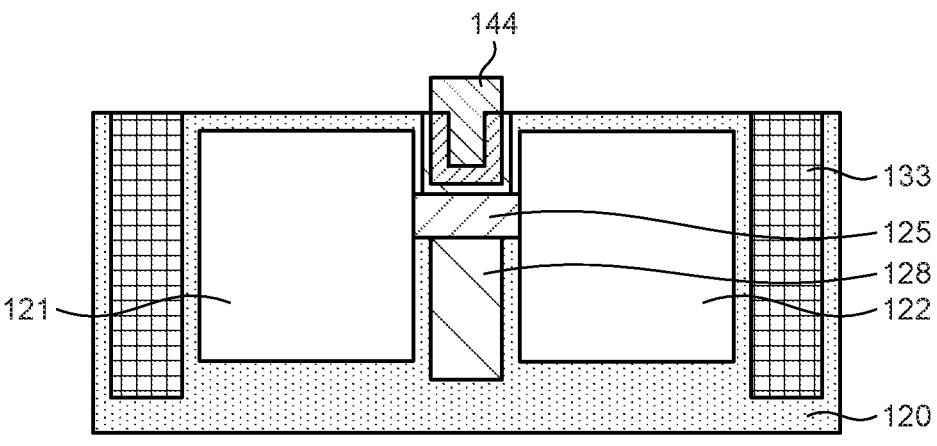
FIG. 22E is a view depicting an example of the method of manufacturing the imaging element according to the sixth embodiment of the present disclosure.

FIGS. 22A to 22E are views depicting an example of the method of manufacturing the imaging element according to the sixth embodiment of the present disclosure. FIGS. 22A to 22E are views depicting an example of a manufacturing process of a portion of the pixel 100 in the imaging element 1. First, the pixel separator 133 is formed on the front surface side of the semiconductor substrate 120. Next, the intra-pixel separator 128 is formed on the semiconductor substrate 120. Next, the semiconductor regions 121 and 122 are formed on the semiconductor substrate 120. Next, an opening 145 is formed on the front surface side of the semiconductor substrate 120. This can be performed by dry etching (FIG. 22A).

Next, a film 301 of SiO$_2$ or the like is disposed in the opening 145 (FIG. 22B). The film 301 is referred to as what is called a sacrificial film.

Next, ion implantation is performed through the film 301 to form a p-type semiconductor region 129 on the semiconductor substrate 120 on the bottom surface and the side surface of the opening 145 (FIG. 22C).

Next, the semiconductor region 125 of the overflow path 108 is formed (FIG. 22D). This can be performed by ion implantation.

Next, the film 301 is peeled off. Next, a gate oxide film is disposed in the opening 145. Next, a gate electrode member is disposed in the opening 145 to form the gate electrode 144 (FIG. 22E).

The gate electrode 144 can be formed by the above steps. Note that the semiconductor region 129 formed in FIG. 22C is disposed in order to prevent a potential other than the overflow path 108 portion from being modulated by the gate electrode 144 and forming an unintended electron path. In addition, by disposing the semiconductor region 129, it is also possible to suppress the generation of dark current due to the defect level of the wall surface of the opening 145.

The configuration of the imaging element 1 other than this is similar to the configuration of the imaging element 1 in the fourth embodiment of the present disclosure, and thus description thereof is omitted.

As described above, the imaging element 1 according to the sixth embodiment of the present disclosure includes the overflow gate 109 having the gate electrode 144 at least a part of which is embedded in the semiconductor substrate 120. Thus, the influence of the charge transfer sections 105 and 106 on the overflow path 108 can be reduced.

7. Seventh Embodiment

In the imaging element 1 of the above-described sixth embodiment, the gate electrode 144 embedded in the semiconductor substrate 120 is disposed. On the other hand, the imaging element 1 according to a seventh embodiment of the present disclosure is different from the above-described sixth embodiment in that an embedded insulating film is disposed around the gate electrode 144.

[Configuration of Imaging Element]

Figure 23:
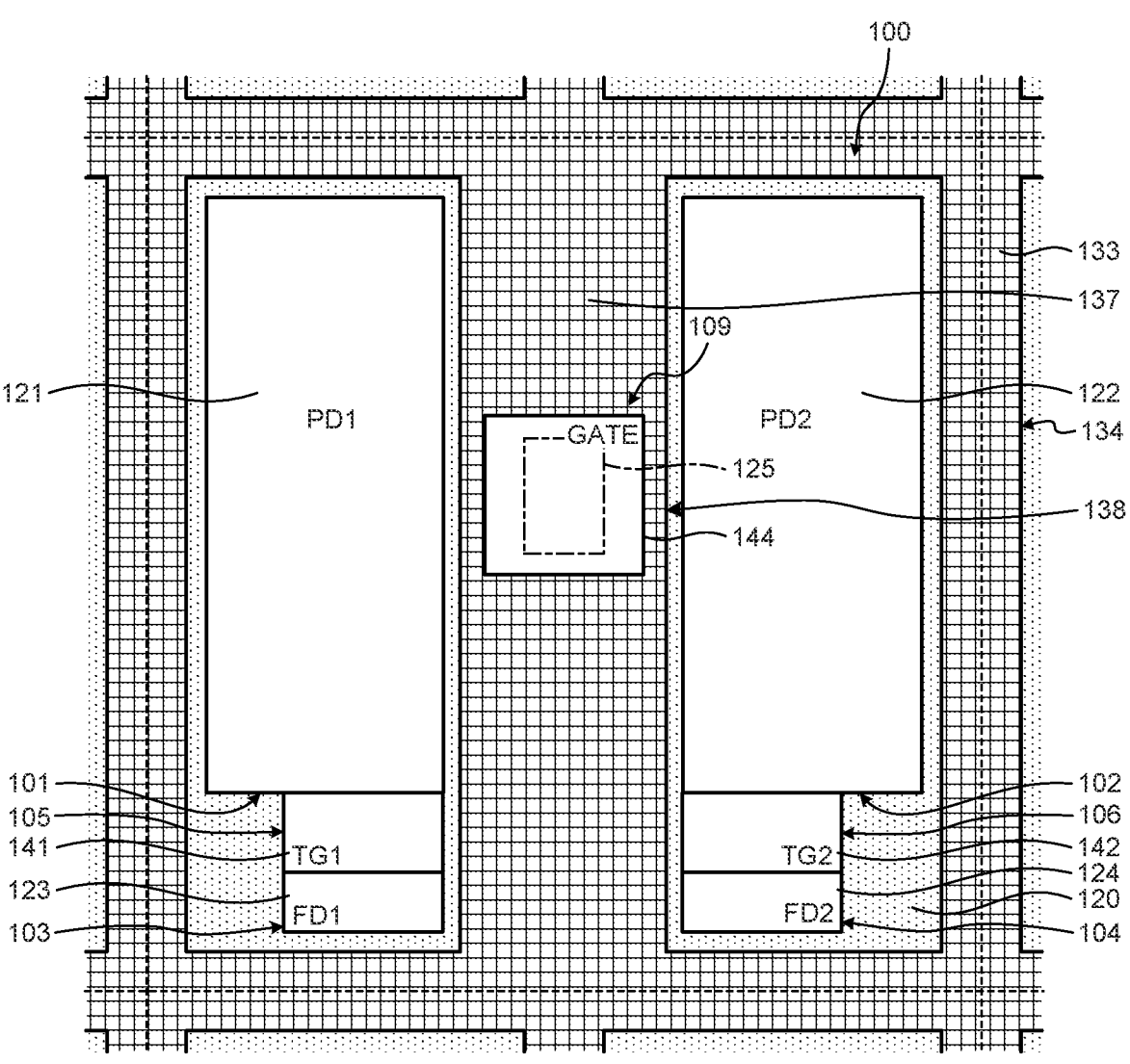
FIG. 23 is a view depicting a configuration example of a pixel according to a seventh embodiment of the present disclosure.

FIG. 23 is a view depicting a configuration example of the pixel 100 according to a seventh embodiment of the present disclosure. The drawing is a plan view depicting the configuration example of the imaging element 1, as in FIG. 20. The pixel 100 in the drawing is different from the pixel 100 in FIG. 20 in that an embedded insulating film is disposed around the gate electrode 144.

[Configuration of Cross-Section of Imaging Element]

Figure 24A:
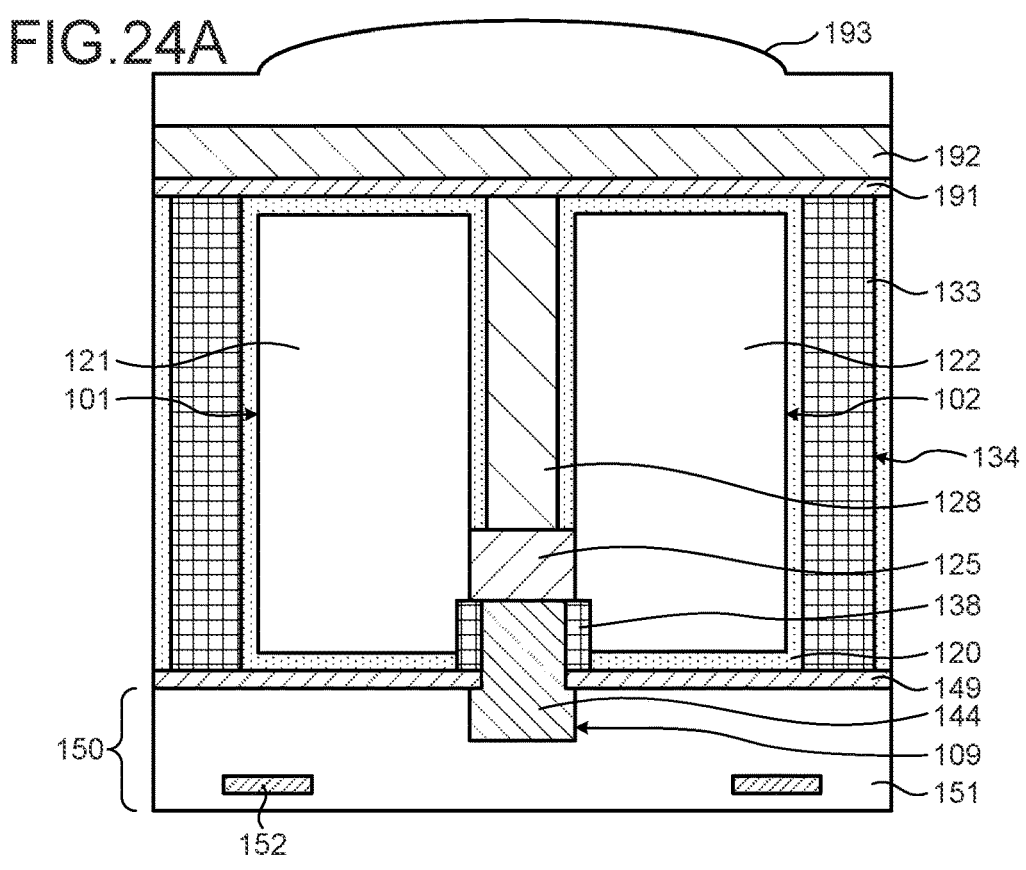
FIG. 24A is a cross-sectional view depicting the configuration example of the pixel according to the seventh embodiment of the present disclosure.
Figure 24B:
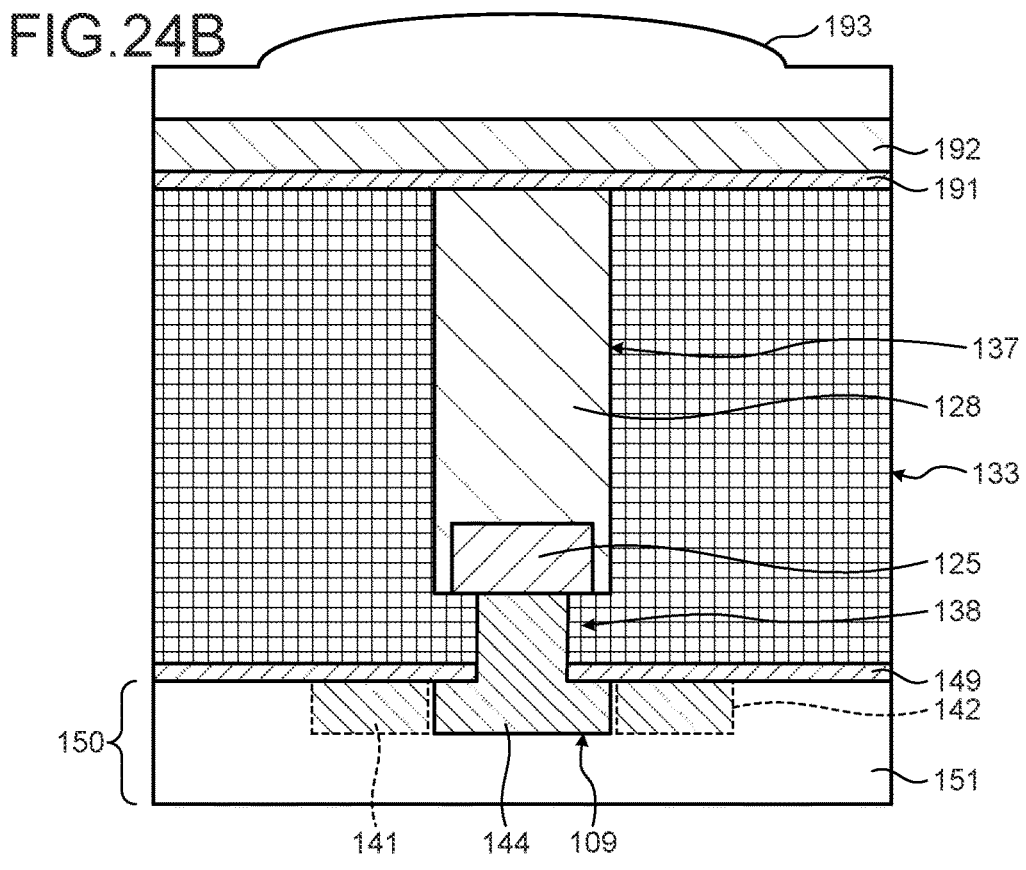
FIG. 24B is a cross-sectional view depicting the configuration example of the pixel according to the seventh embodiment of the present disclosure.

FIGS. 24A and 24B are cross-sectional views depicting the configuration example of the pixel according to a seventh embodiment of the present disclosure. FIGS. 24A and 24B are cross-sectional views depicting a configuration example of the pixel 100 as in FIGS. 21A and 21B. The pixel 100 in FIGS. 24A and 24B is different from the pixel 100 in FIGS. 21A and 21B in that an embedded insulating film 138 is disposed around the gate electrode 144. As illustrated in the drawing, the embedded insulating film 138 is disposed around the gate electrode 144 embedded in the semiconductor substrate 120. Such an embedded insulating film 138 is referred to as shallow trench isolation (STI).

This STI can be formed by forming an opening in the semiconductor substrate 120 and embedding an insulating film. By forming the opening 145 described in FIG. 22A in the central portion of the STI and disposing the gate electrode 144, the embedded insulating film 138 can be disposed around the gate electrode 144. Since the side surface of the gate electrode 144 is insulated by the embedded insulating film 138, modulation of the potential barrier other than the overflow path 108 by the gate electrode 144 can be prevented. The controllability of the potential barrier of the overflow path 108 can be improved. Note that, in order to suppress the dark current caused by the interface between the embedded insulating film 138 and the semiconductor substrate 120, the semiconductor region 129 and the like can also be disposed as described in FIG. 22C. Note that the embedded insulating film 138 is an example of a separator described in the claims.

The configuration of the imaging element 1 other than this is similar to the configuration of the imaging element 1 in the sixth embodiment of the present disclosure, and thus description thereof is omitted.

As described above, the imaging element 1 according to the seventh embodiment of the present disclosure can prevent the gate electrode 144 from modulating the potential barrier other than the overflow path 108 by disposing the embedded insulating film 138 around the gate electrode 144. The controllability of the potential barrier of the overflow path 108 can be improved.

8. Eighth Embodiment

The imaging element 1 of the first embodiment described above includes the semiconductor substrate 120. On the other hand, the imaging element 1 according to an eighth embodiment of the present disclosure is different from the above-described first embodiment in that a plurality of semiconductor substrates is stacked.

[Configuration of Imaging Element]

Figure 25:
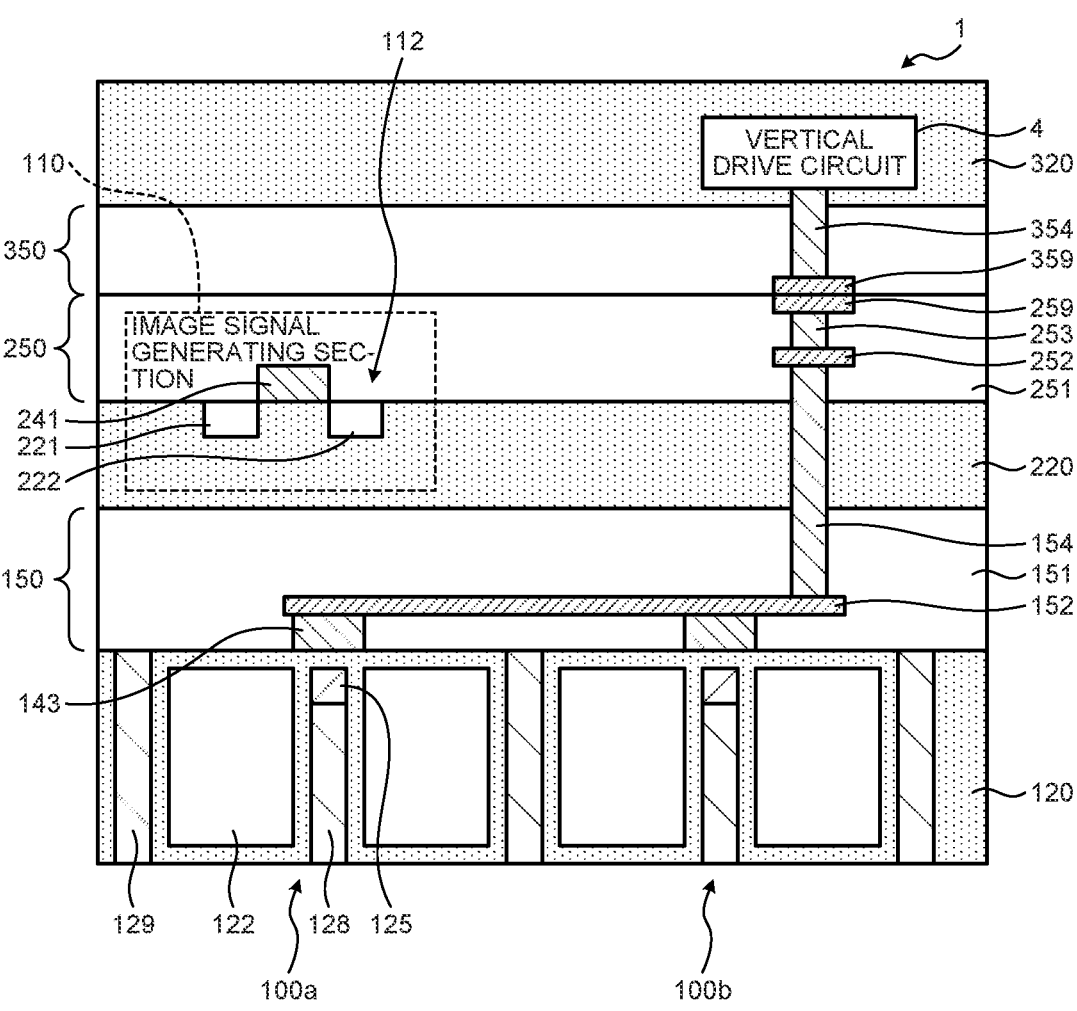
FIG. 25 is a diagram depicting a configuration example of an imaging element according to an eighth embodiment of the present disclosure.

FIG. 25 is a diagram depicting a configuration example of an imaging element according to an eighth embodiment of the present disclosure. The drawing is a cross-sectional view depicting a configuration example of the imaging element 1. The imaging element 1 in the drawing is different from the imaging element 1 in FIG. 1 in that the imaging element 1 in the drawing is configured by stacking semiconductor substrates 220 and 320 on a semiconductor substrate 120.

In the semiconductor substrate 120 of the drawing, the photoelectric conversion sections 101 and 102, the charge transfer sections 105 and 106, which are not illustrated, and the charge holding sections 103 and 104, which are not illustrated, are disposed in the pixel 100. In addition, the overflow path 108 and the overflow gate 109 of the pixel 100 are disposed on the semiconductor substrate 120. Note that. Pixels 100*a* and 100*b* are illustrated on the semiconductor substrate 120 in the drawing.

The wiring 152 is illustrated in the wiring region 150 of the drawing. The wiring 152 is commonly connected to the gate electrode 143 of each of the pixels 100*a* and 100*b*. The wiring 152 can include, for example, polycrystalline silicon into which impurities are implanted.

The semiconductor substrate 220 is a semiconductor substrate including a wiring region 250 and stacked on the semiconductor substrate 120. The image signal generating section 110 is disposed on the semiconductor substrate 220. In the image signal generating section 110 in the drawing, the amplification transistor 112 has been described as an example. The amplification transistor 112 includes semiconductor regions 221 and 222 formed in a semiconductor substrate 220 and a gate electrode 241.

The wiring region 250 includes an insulating layer 251, a wiring 252, a via plug 253, and a connection pad 259. The connection pad 259 is electrically connected to a connection pad 359 of a wiring region 350 of the semiconductor substrate 320 described later. Note that a through via 154 for connecting the semiconductor substrate 120 and the semiconductor substrate 220 is disposed. The through via 154 in the drawing connects the wirings 152 and 252. The through via 154 can include a columnar tungsten (W) or the like.

The semiconductor substrate 320 is a semiconductor substrate including a wiring region 350 and stacked on the semiconductor substrate 220. The vertical drive circuit 4 and the like are disposed on the semiconductor substrate 320.

In the wiring region 350, an insulating layer 351, a wiring 352, a via plug 354, and the connection pad 359 are disposed.

The gate voltage of the gate electrode 143 of the overflow gate 109 is supplied from the vertical drive circuit 4 via the wiring 152, the through via 154, the wiring 252, the via plug 253, the connection pads 259 and 359, and the via plug 354. By commonly connecting the plurality of gate electrodes 143 to the wiring 152, the number of through-vias 154 can be reduced.

[Configuration of Pixel]

Figure 26A:
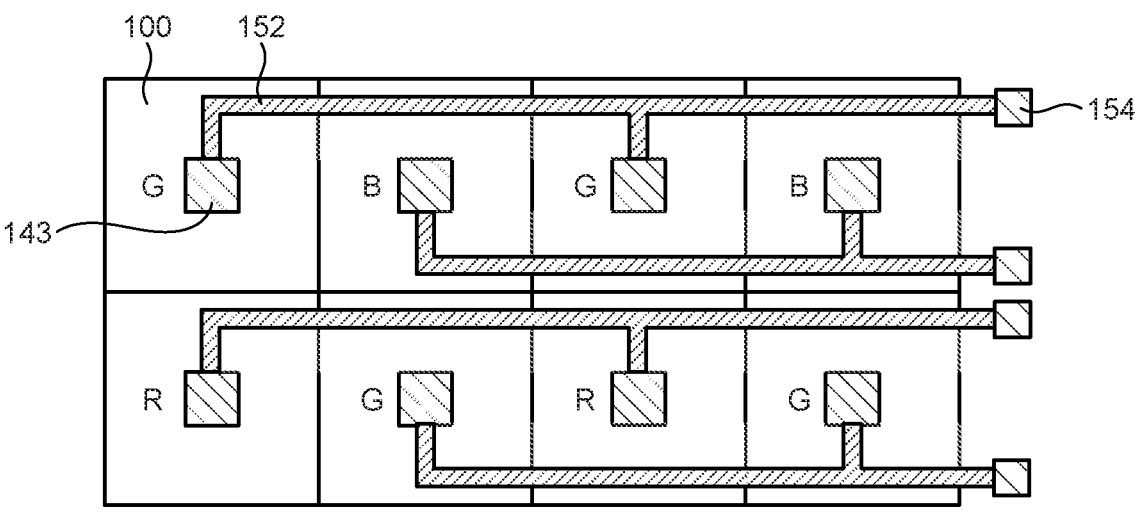
FIG. 26A is a view depicting the configuration example of the imaging element according to the eighth embodiment of the present disclosure.
Figure 26B:
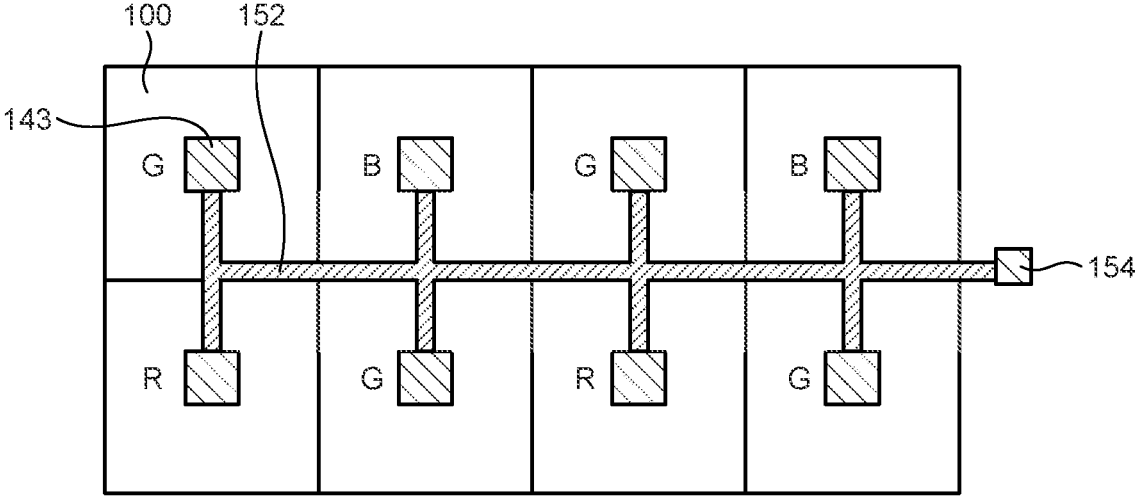
FIG. 26B is a view depicting the configuration example of the imaging element according to the eighth embodiment of the present disclosure.

FIGS. 26A and 26B are views depicting a configuration example of an imaging element according to an eighth embodiment of the present disclosure. FIGS. 26A and 26B are plan views depicting an arrangement example of the wiring 152 in the semiconductor substrate 120. In FIGS. 26A and 26B, four pixels 100 are illustrated. The description of "R", "G", and "B" of these pixels 100 represents the type of the color filter 192.

FIG. 26A illustrates an example in which the gate electrodes 143 of the pixels 100 in which the color filters 192 of the same type are disposed are commonly connected to the same wiring 152. In the pixels 100 in which the color filters 192 of the same type are disposed, a gate voltage is applied to the gate electrodes 143 at a common timing. Accordingly, the gate voltages of these pixels 100 are supplied from the common wiring 152.

FIG. 26B illustrates an example in which the wiring 152 is commonly connected to the gate electrodes 143 of eight pixels 100. The number of through-vias 154 can be further reduced.

9. Configuration Example of Imaging Device

The imaging element 1 as described above can be applied to various electronic devices such as an imaging system such as a digital still camera or a digital video camera, a mobile phone having an imaging function, or another device having an imaging function.

Figure 27:
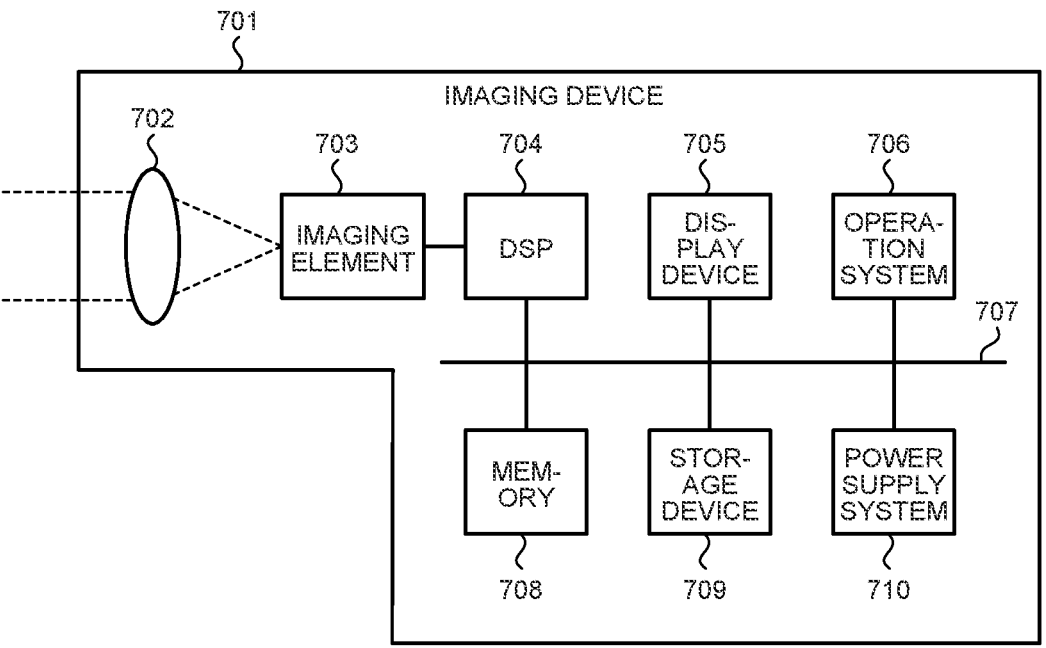
FIG. 27 is a block diagram depicting a configuration example of an imaging device mounted on an electronic device.

FIG. 27 is a block diagram depicting a configuration example of an imaging device mounted on an electronic device.

As illustrated in FIG. 27, an imaging device 701 includes an optical system 702, an imaging element 703, and a digital signal processor (DSP) 704, and is configured by connecting a DSP 704, a display device 705, an operation system 706, a memory 708, a recording device 709, and a power supply system 710 via a bus 707, and is capable of capturing a still image and a moving image.

The optical system 702 includes one or more lenses, guides image light (incident light) from a subject to the imaging element 703, and forms an image on a light receiving surface (sensor unit) of the imaging element 703.

As the imaging element 703, the imaging element 1 of any of the above-described configuration examples is applied. Electrons are accumulated in the imaging element 703 for a certain period depending on an image formed on the light receiving surface via the optical system 702. Then, a signal corresponding to the electrons accumulated in the imaging element 703 is input to the DSP 704.

The DSP 704 performs various types of signal processing on the signal from the imaging element 703 to acquire an image, and temporarily stores data of the image in the memory 708. The image data stored in the memory 708 is recorded in the recording device 709 or supplied to the display device 705 to display an image. Furthermore, the operation system 706 receives various operations by the user and supplies an operation signal to each block of the imaging device 701, and the power supply system 710 supplies power necessary for driving each block of the imaging device 701.

10. Application Example to Mobile Body

The technology according to the present disclosure (present technology) can be applied to various products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a boat, a robot, and the like.

Figure 28:
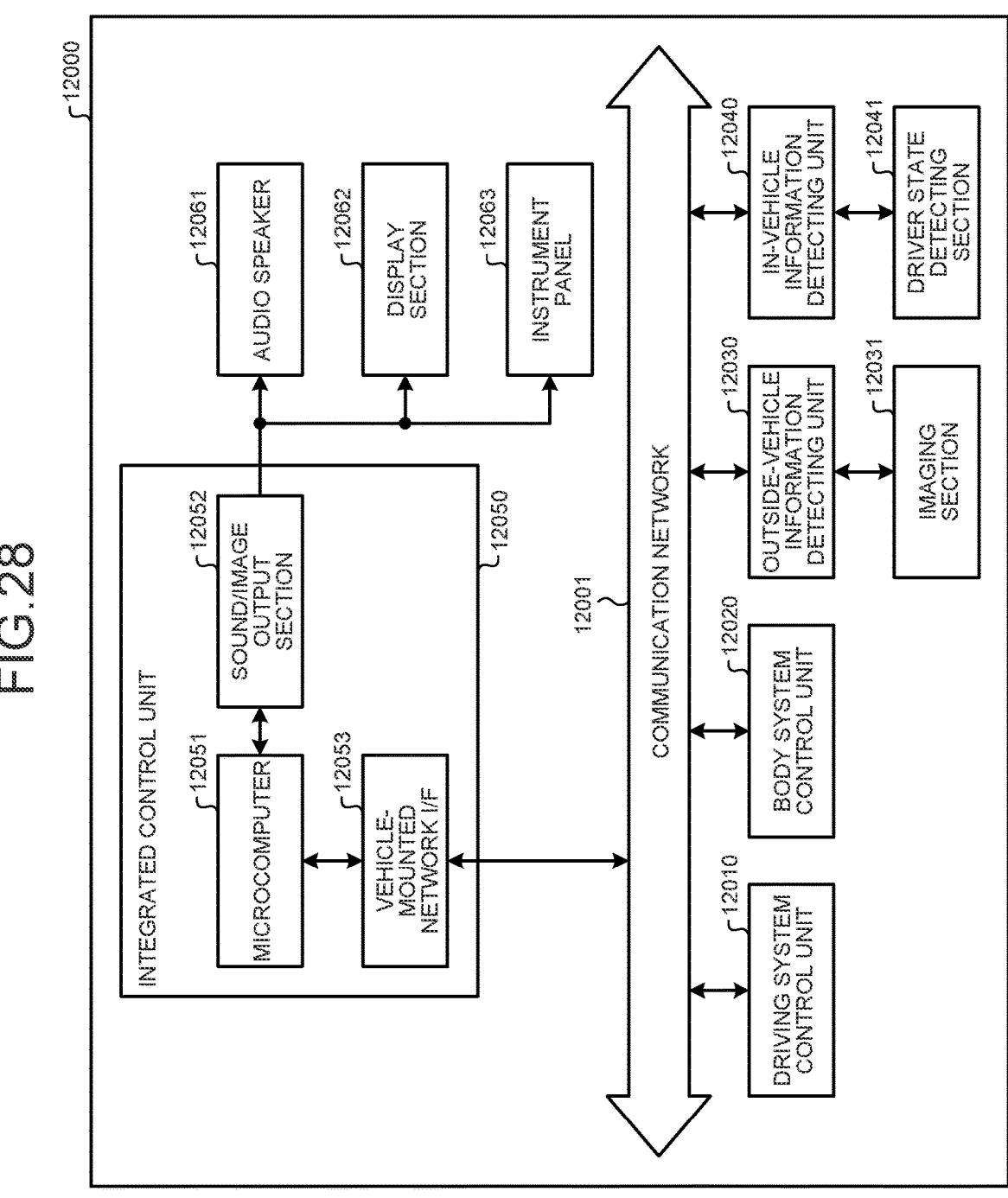
FIG. 28 is a block diagram depicting an example of schematic configuration of a vehicle control system.

FIG. 28 is a block diagram depicting an example of schematic configuration of a vehicle control system as an example of a mobile body control system to which the technology according to an embodiment of the present disclosure can be applied.

A vehicle control system 12000 includes a plurality of electronic control units connected to each other via a communication network 12001. In the example depicted in FIG. 28, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 28, an audio speaker 12061, a display section 12062, and an instrument panel 12063 are illustrated as the output device. The display section 12062 may, for example, include at least one of an on-board display and a head-up display.

Figure 29:
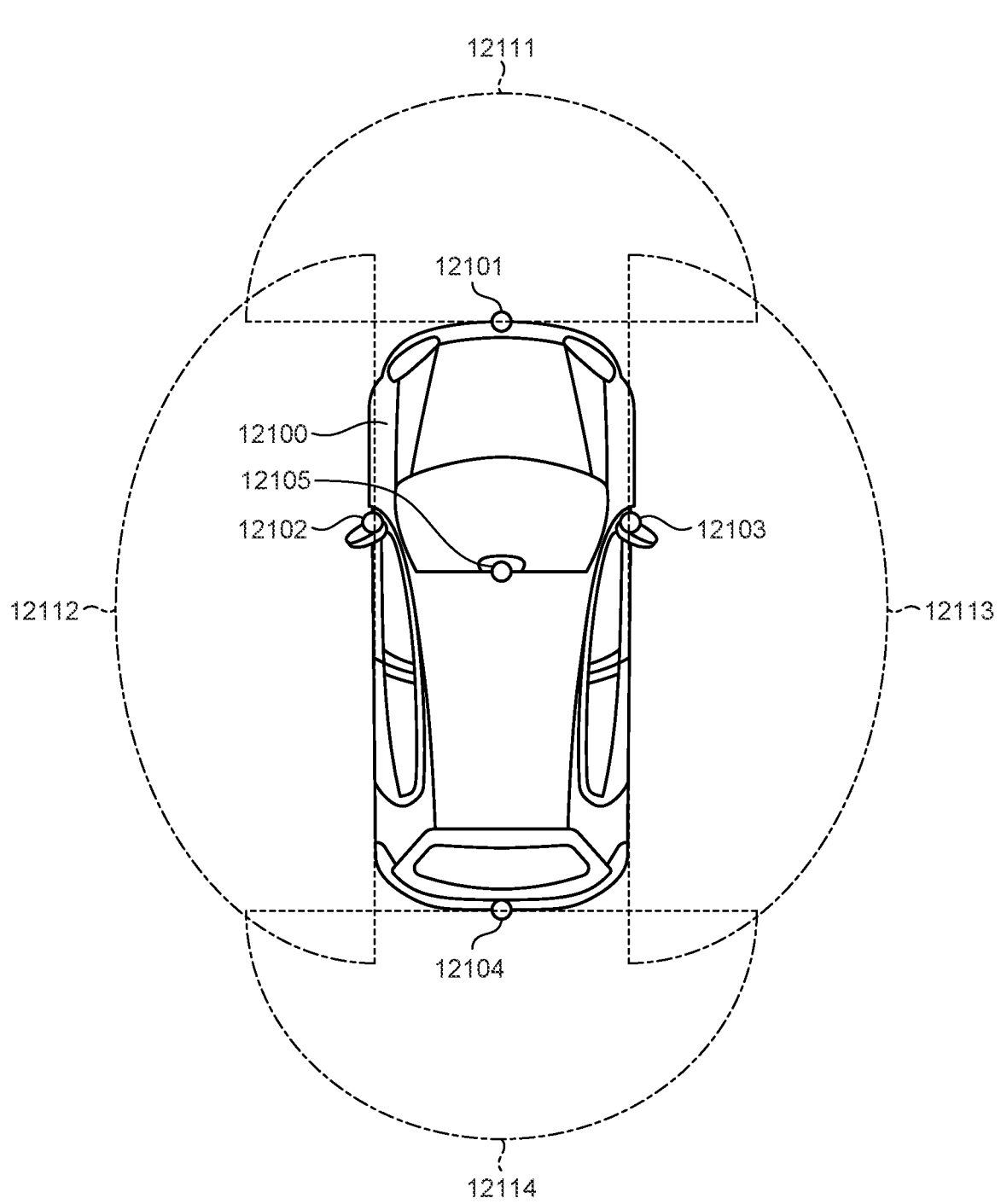
FIG. 29 is a diagram of assistance in explaining an example of installation positions of an outside-vehicle information detecting section and an imaging section.

FIG. 29 is a diagram depicting an example of the installation position of the imaging section 12031.

In FIG. 29, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of a vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 29 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 among the configurations described above. Specifically, the imaging element 1 in FIG. 1 can be applied to the imaging section 12031.

11. Application Example to Endoscopic Surgery System

The technology according to the present disclosure (present technology) can be applied to various products. For example, the technology according to the present disclosure may be applied to an endoscopic surgery system.

Figure 30:
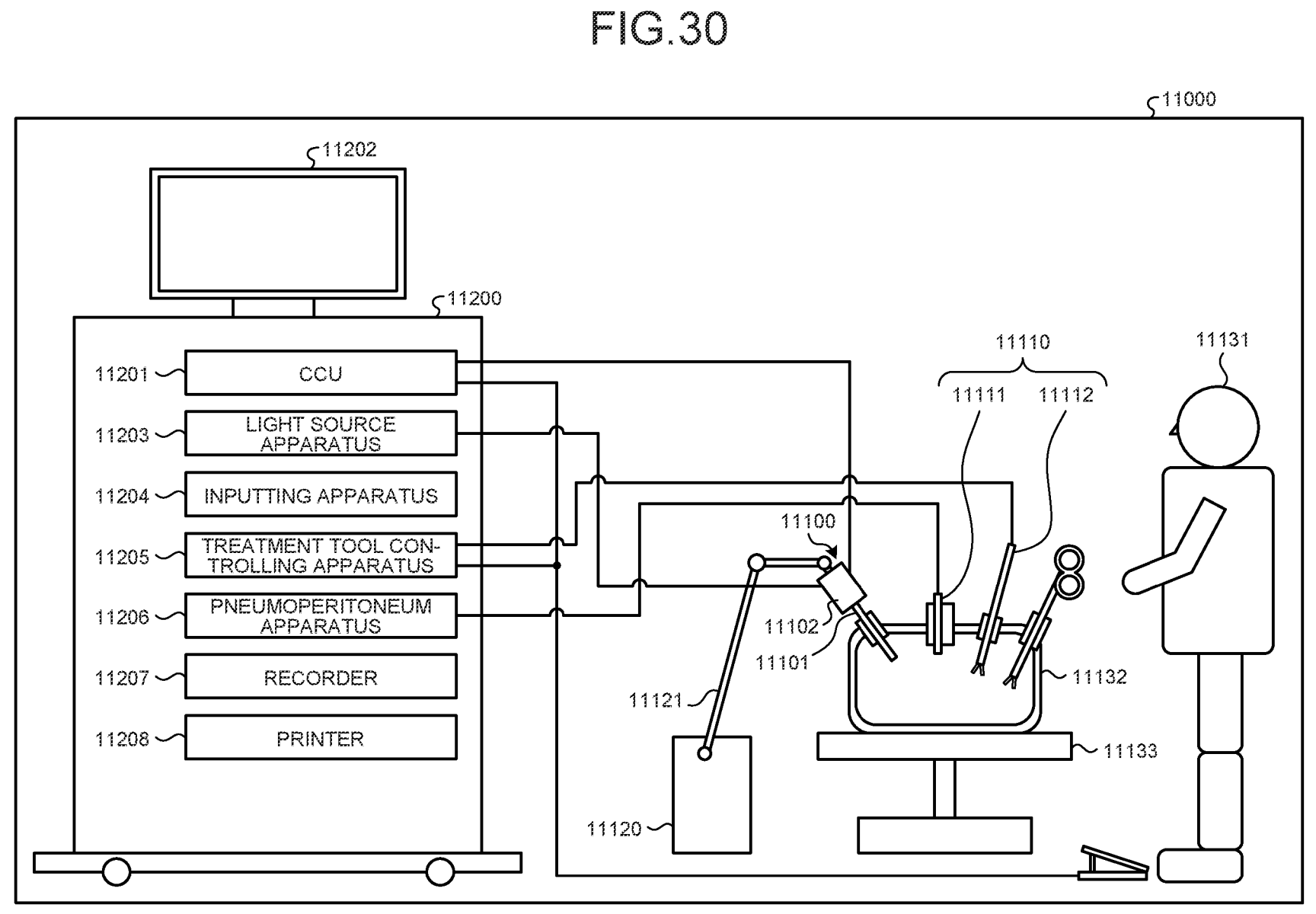

FIG. 30 is a view depicting an example of a schematic configuration of an endoscopic surgery system to which the technology according to an embodiment of the present disclosure (present technology) can be applied.

In FIG. 30, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 31:
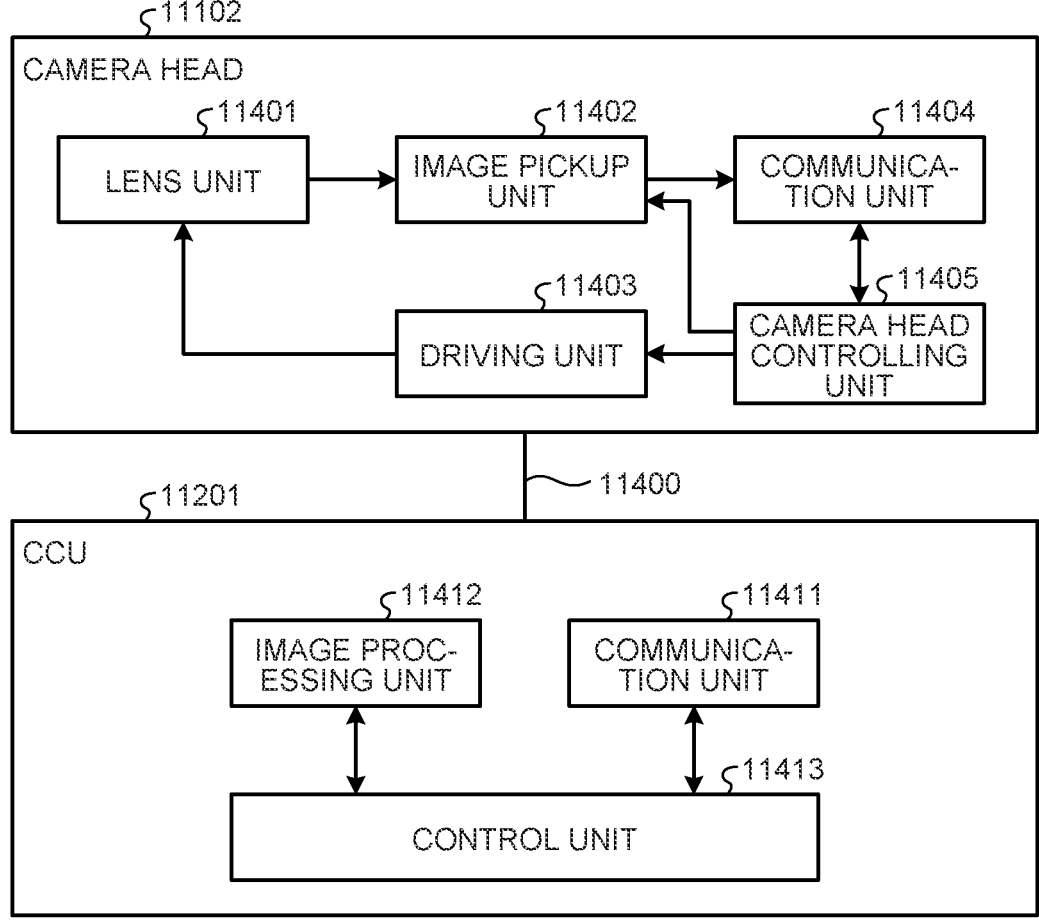
FIG. 31 is a block diagram depicting an example of a functional configuration of a camera head and a camera control unit (CCU).

FIG. 31 is a block diagram depicting an example of a functional configuration of the camera head 11102 and the CCU 11201 depicted in FIG. 30.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to the endoscope 11100 and the image pickup unit 11402 of the camera head 11102 among the above-described configurations. Specifically, the imaging element 1 in FIG. 1 can be applied to the image pickup unit 11402.

Note that, here, the endoscopic surgery system has been described as an example, but the technology according to the present disclosure may be applied to, for example, a microscopic surgery system or the like.

Note that the effects described in the present description are merely examples and are not limited, and other effects may be provided.

Note that the present technology can also have the following configurations.

(1)

An imaging element comprising:

a pixel including a plurality of photoelectric conversion sections that is formed on a semiconductor substrate and performs photoelectric conversion of incident light from a subject to generate a charge;

an intra-pixel separator that is disposed in the pixel and separates the plurality of photoelectric conversion sections;

an overflow path that is disposed in the intra-pixel separator and transfers charges overflowed in the plurality of photoelectric conversion sections to each other;

an overflow gate that is disposed in the pixel and adjusts a potential of the overflow path;

a pixel separator disposed at a boundary of the pixel;

a charge holding section that holds the generated charge;

a plurality of charge transfer sections that is disposed one-by-one for the plurality of photoelectric conversion sections and transfers the generated charge to the charge holding section and causes the charge holding section to hold the charge; and an image signal generating section that generates an image signal on a basis of the held charge.

(2)

The imaging element according to the above (1), wherein the plurality of charge transfer sections performs collective transfer in which charges respectively generated by the plurality of photoelectric conversion sections are commonly transferred to the charge holding section and charges respectively generated by the plurality of photoelectric conversion sections are simultaneously collectively held in the charge holding section, and individual transfer in which charges respectively generated by the plurality of photoelectric conversion sections are individually transferred to the charge holding section, and the image signal generating section generates the image signal on a basis of the charges collectively held in the charge holding section by the collective transfer, and generates a plurality of phase difference signals for performing pupil division on the subject and detecting an image plane phase difference on a basis of the respective charges individually held in the charge holding section by the individual transfer.

(3)

The imaging element according to the above (2), wherein the overflow gate adjusts the potential when the charges transferred by the individual transfer are generated.

(4)

The imaging element according to any one of the above (1) to (3), wherein the intra-pixel separator is formed by a semiconductor region of the semiconductor substrate.

(5)

The imaging element according to the above (4), wherein the intra-pixel separator is adjusted to have a potential lower than a potential of the charge transfer sections.

(6)

The imaging element according to any one of the above (1) to (5), wherein the pixel separator is formed by a semiconductor region of the semiconductor substrate.

(7)

The imaging element according to any one of the above (1) to (6), wherein the pixel separator includes an insulating member embedded in a trench formed in the semiconductor substrate.

(8)

The imaging element according to any one of the above (1) to (7), further comprising a second intra-pixel separator including an insulating member embedded in a trench formed in the semiconductor substrate and separating the plurality of photoelectric conversion sections.

(9)

The imaging element according to any one of the above (1) to (8), wherein the plurality of charge transfer sections is disposed near a boundary of the pixel inside the pixel, and the overflow gate is disposed near a boundary of the pixel facing a boundary of the pixel near which the plurality of charge transfer sections is disposed.

(10)

The imaging element according to any one of the above (1) to (9), wherein at least a part of the overflow gate is embedded in the semiconductor substrate, and the overflow path is disposed below the overflow gate.

(11)

The imaging element according to the above (10), further comprising a separator including an insulating member embedded in the semiconductor substrate and disposed adjacent to a side surface of the overflow gate.

(12)

The imaging element according to any one of the above (1) to (11), wherein the semiconductor substrate includes a plurality of the pixels, a plurality of the charge transfer sections, and the charge holding section, and a second semiconductor substrate including the image signal generating section and stacked on the semiconductor substrate is further included.

(13)

The imaging element according to the above (12), further comprising:

a common wiring disposed between the semiconductor substrate and the second semiconductor substrate and commonly connecting the respective overflow gates of the plurality of pixels; and a connecting location that connects the common wiring and the image signal generating section.

(14)

An imaging device, comprising:

a pixel including a plurality of photoelectric conversion sections that is formed on a semiconductor substrate and performs photoelectric conversion of incident light from a subject to generate a charge;

an intra-pixel separator that is disposed in the pixel and separates the plurality of photoelectric conversion sections;

an overflow path that is disposed in the intra-pixel separator and transfers charges overflowed in the plurality of photoelectric conversion sections to each other;

an overflow gate that is disposed in the pixel and adjusts a potential of the overflow path;

a pixel separator disposed at a boundary of the pixel;

an image signal generating section that generates an image signal on a basis of the generated charge; and a processing circuit that processes the generated image signal.

REFERENCE SIGNS LIST 1, 703 IMAGING ELEMENT
2 LIGHT RECEIVING PIXEL
4 VERTICAL DRIVE CIRCUIT
5 COLUMN SIGNAL PROCESSING CIRCUIT
100, 100a, 100b PIXEL
101, 102 PHOTOELECTRIC CONVERSION SECTION
103, 104 CHARGE HOLDING SECTION
105, 106 CHARGE TRANSFER SECTION
108 OVERFLOW PATH
109 OVERFLOW GATE
110 IMAGE SIGNAL GENERATING SECTION
120, 220 SEMICONDUCTOR SUBSTRATE
128 INTRA-PIXEL SEPARATOR
129, 131, 133 PIXEL SEPARATOR
135, 137 INTRA-PIXEL SEPARATOR
141, 143, 144 GATE ELECTRODE

152, 252, 352 WIRING
701 IMAGING DEVICE
11402, 12031, 12101 to 12105 IMAGE PICKUP UNIT,
IMAGING SECTION

What is claimed is:

1. An imaging element, comprising:
a pixel including a plurality of photoelectric conversion
sections that is formed on a semiconductor substrate
and performs photoelectric conversion of incident light
from a subject to generate a charge;
an intra-pixel separator that is disposed in the pixel and
separates the plurality of photoelectric conversion sec-
tions;
an overflow path that is disposed in the intra-pixel sepa-
rator and transfers charges overflowed in the plurality
of photoelectric conversion sections to each other;
an overflow gate that is disposed in the pixel and adjusts
a potential of the overflow path;
a pixel separator disposed at a boundary of the pixel;
a charge holding section that holds the generated charge;
a plurality of charge transfer sections that is disposed
one-by-one for the plurality of photoelectric conversion
sections and transfers the generated charge to the
charge holding section and causes the charge holding
section to hold the charge; and
an image signal generating section that generates an
image signal on a basis of the held charge,
wherein the semiconductor substrate includes a plurality
of the pixels, a plurality of the charge transfer sections,
and the charge holding section;
a second semiconductor substrate including the image
signal generating section and stacked on the semicon-
ductor substrate is further included;
a common wiring disposed between the semiconductor
substrate and the second semiconductor substrate and
commonly connecting the respective overflow gates of
the plurality of pixels; and
a connecting location that connects the common wiring
and the image signal generating section.
2. The imaging element according to claim 1, wherein
the plurality of charge transfer sections performs collec-
tive transfer in which charges respectively generated by
the plurality of photoelectric conversion sections are
commonly transferred to the charge holding section and
charges respectively generated by the plurality of pho-
toelectric conversion sections are simultaneously col-
lectively held in the charge holding section, and indi-
vidual transfer in which charges respectively generated
by the plurality of photoelectric conversion sections are
individually transferred to the charge holding section,
and
the image signal generating section generates the image
signal on a basis of the charges collectively held in the
charge holding section by the collective transfer, and
generates a plurality of phase difference signals for
performing pupil division on the subject and detecting
an image plane phase difference on a basis of the
respective charges individually held in the charge hold-
ing section by the individual transfer.
3. The imaging element according to claim 2, wherein the
overflow gate adjusts the potential when the charges trans-
ferred by the individual transfer are generated.
4. The imaging element according to claim 1, wherein the
intra-pixel separator is formed by a semiconductor region of
the semiconductor substrate.

5. The imaging element according to claim 4, wherein the
intra-pixel separator is adjusted to have a potential lower
than a potential of the charge transfer sections.
6. The imaging element according to claim 1, wherein the
pixel separator is formed by a semiconductor region of the
semiconductor substrate.
7. The imaging element according to claim 1, wherein the
pixel separator includes an insulating member embedded in
a trench formed in the semiconductor substrate.
8. The imaging element according to claim 1, further
comprising a second intra-pixel separator including an insu-
lating member embedded in a trench formed in the semi-
conductor substrate and separating the plurality of photo-
electric conversion sections.
9. The imaging element according to claim 1, wherein
the plurality of charge transfer sections is disposed near a
boundary of the pixel inside the pixel, and
the overflow gate is disposed near a boundary of the pixel
facing a boundary of the pixel near which the plurality
of charge transfer sections is disposed.
10. The imaging element according to claim 1, wherein
at least a part of the overflow gate is embedded in the
semiconductor substrate, and
the overflow path is disposed below the overflow gate.
11. The imaging element according to claim 10, further
comprising a separator including an insulating member
embedded in the semiconductor substrate and disposed
adjacent to a side surface of the overflow gate.
12. An imaging device, comprising:
a pixel including a plurality of photoelectric conversion
sections that is formed on a semiconductor substrate
and performs photoelectric conversion of incident light
from a subject to generate a charge;
an intra-pixel separator that is disposed in the pixel and
separates the plurality of photoelectric conversion sec-
tions;
an overflow path that is disposed in the intra-pixel sepa-
rator and transfers charges overflowed in the plurality
of photoelectric conversion sections to each other;
an overflow gate that is disposed in the pixel and
adjusts a potential of the overflow path, wherein at
least a part of the overflow gate is embedded in the
semiconductor substrate, and wherein the overflow
path is disposed below the overflow gate;
a pixel separator disposed at a boundary of the pixel;
an image signal generating section that generates an
image signal on a basis of the generated charge;
a processing circuit that processes the generated image
signal; and
a separator including an insulating member embedded in
the semiconductor substrate and disposed adjacent to a
side surface of the overflow gate.
13. An imaging element, comprising:
a pixel including a plurality of photoelectric conversion
sections that is formed on a semiconductor substrate
and performs photoelectric conversion of incident light
from a subject to generate a charge;
an intra-pixel separator that is disposed in the pixel and
separates the plurality of photoelectric conversion sec-
tions;
an overflow path that is disposed in the intra-pixel sepa-
rator and transfers charges overflowed in the plurality
of photoelectric conversion sections to each other;
an overflow gate that is disposed in the pixel and adjusts
a potential of the overflow path, wherein at least a part of the overflow gate is embedded in the semiconductor substrate, and wherein the overflow path is disposed below the overflow gate;

a pixel separator disposed at a boundary of the pixel;

a charge holding section that holds the generated charge;

a plurality of charge transfer sections that is disposed one-by-one for the plurality of photoelectric conversion sections and transfers the generated charge to the charge holding section and causes the charge holding section to hold the charge;

an image signal generating section that generates an image signal on a basis of the held charge; and a separator including an insulating member embedded in the semiconductor substrate and disposed adjacent to a side surface of the overflow gate.

14. The imaging element according to claim 13, wherein the plurality of charge transfer sections performs collective transfer in which charges respectively generated by the plurality of photoelectric conversion sections are commonly transferred to the charge holding section and charges respectively generated by the plurality of photoelectric conversion sections are simultaneously collectively held in the charge holding section, and individual transfer in which charges respectively generated by the plurality of photoelectric conversion sections are individually transferred to the charge holding section, and the image signal generating section generates the image signal on a basis of the charges collectively held in the charge holding section by the collective transfer, and generates a plurality of phase difference signals for performing pupil division on the subject and detecting an image plane phase difference on a basis of the respective charges individually held in the charge holding section by the individual transfer.

15. The imaging element according to claim 14, wherein the overflow gate adjusts the potential when the charges transferred by the individual transfer are generated.

16. The imaging element according to claim 13, wherein the intra-pixel separator is formed by a semiconductor region of the semiconductor substrate.

17. The imaging element according to claim 16, wherein the intra-pixel separator is adjusted to have a potential lower than a potential of the charge transfer sections.

18. The imaging element according to claim 13, wherein the pixel separator is formed by a semiconductor region of the semiconductor substrate.

19. The imaging element according to claim 13, wherein the pixel separator includes an insulating member embedded in a trench formed in the semiconductor substrate.

20. The imaging element according to claim 13, further comprising a second intra-pixel separator including an insulating member embedded in a trench formed in the semiconductor substrate and separating the plurality of photoelectric conversion sections.

* * * * *